United States Patent
Huh et al.

(10) Patent No.: US 10,491,987 B2
(45) Date of Patent: Nov. 26, 2019

(54) ELECTRONIC DEVICE INCLUDING FLEXIBLE HOUSING

(71) Applicant: Samsung Electronics Co., Ltd., Gyeonggi-do (KR)

(72) Inventors: Jae Young Huh, Seoul (KR); Dae Hyun Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 65 days.

(21) Appl. No.: 15/725,803

(22) Filed: Oct. 5, 2017

(65) Prior Publication Data

US 2018/0109871 A1    Apr. 19, 2018

(30) Foreign Application Priority Data

Oct. 13, 2016   (KR) .................. 10-2016-0132510

(51) Int. Cl.
| | | |
|---|---|---|
| *H04R 17/00* | (2006.01) | |
| *H04R 1/28* | (2006.01) | |
| *H04R 17/02* | (2006.01) | |
| *H05K 5/00* | (2006.01) | |
| *H05K 5/02* | (2006.01) | |

(Continued)

(52) U.S. Cl.
CPC ......... *H04R 1/2811* (2013.01); *G06F 1/1652* (2013.01); *G06F 1/1681* (2013.01); *H04M 1/0202* (2013.01); *H04R 17/02* (2013.01); *H05K 5/0017* (2013.01); *H05K 5/0217* (2013.01); *H05K 5/0226* (2013.01); *H05K 5/03* (2013.01); *H04M 1/0268* (2013.01); *H04M 1/03* (2013.01); *H04R 1/025* (2013.01); *H04R 1/028* (2013.01); *H04R 17/00* (2013.01); *H04R 2499/11* (2013.01)

(58) Field of Classification Search
CPC ...... H04R 1/2811; H04R 1/025; H04R 17/02; H04R 2499/11; H04R 1/028; H04R 17/00; H05K 5/0017; H05K 5/0217; H05K 5/0226; H05K 5/03; G06F 1/1652; G06F 1/1681; H04M 1/0202; H04M 1/0268; H04M 1/03
USPC ....... 381/334, 391, 387, 337, 150; 455/90.3, 455/575.3; 361/679.01
See application file for complete search history.

(56) References Cited

U.S. PATENT DOCUMENTS 7,769,408 B2 *  8/2010  Hansson ............. H04M 1/0285
                                                    455/550.1
9,107,301 B2 *  8/2015  Pan ..................... H05K 5/0226
(Continued)

FOREIGN PATENT DOCUMENTS

| KR | 1020140101274 | 8/2014 |
| KR | 1020150024172 | 3/2015 |

*Primary Examiner* — Vivian C Chin
*Assistant Examiner* — Con P Tran
(74) *Attorney, Agent, or Firm* — The Farrell Law Firm, P.C.

(57) ABSTRACT

An electronic device includes a foldable housing including a first surface, a second surface, and a side surface surrounding a portion of a space between the first surface and the second surface, and a speaker disposed inside the housing. The housing further includes a hinge unit, a first speaker hole formed in a partial area of the side surface, which is adjacent to the speaker, and a second speaker hole formed in a partial area of the first surface, which is adjacent to the speaker. The first speaker hole is opened and the second speaker hole is closed in a state in which the housing is unfolded, and the first speaker hole is closed and the second speaker hole is opened in a state in which the housing is folded.

20 Claims, 38 Drawing Sheets

(51) Int. Cl.
*H05K 5/03* (2006.01)
*H04M 1/02* (2006.01)
*G06F 1/16* (2006.01)
H04R 1/02 (2006.01)
H04M 1/03 (2006.01)

(56) References Cited

U.S. PATENT DOCUMENTS 9,342,106 B2 * 5/2016 Nurmi .................. G06F 1/1652
9,794,660 B2 * 10/2017 Rittenhouse ............ H04R 1/02
2015/0055287 A1 2/2015 Seo
2015/0370287 A1 * 12/2015 Ko ........................ G06F 1/1626
361/749

* cited by examiner

ELECTRONIC DEVICE INCLUDING FLEXIBLE HOUSING

PRIORITY

This application claims priority under 35 U.S.C. § 119(a) to Korean Patent Application Serial No. 10-2016-0132510, which was filed in the Korean Intellectual Property Office on Oct. 13, 2016, the entire content of which is incorporated herein by reference.

BACKGROUND

1. Field of the Disclosure

The present disclosure relates to an electronic device including a flexible housing.

2. Description of Related Art

In recent years, electronic devices have been developed that include a flexible housing that may be used while being bent, folded, or rolled which increases the portability and mobility. A display of the electronic device which is seated on the housing may be flexible and thus may be bent, folded, or rolled to the form desired by the user.

The electronic device, such as a smartphone, may provide execution environments for applications with various functions. For example, the electronic device may help install and execute applications supporting voice communication, photographing, or playback of multimedia contents. Further, the electronic device may include a speaker or a receiver such that audio data, e.g., a voice, may be output while the applications are executed.

However, a light weight and small electronic device, such as a smartphone, may have limited mounting space for internal elements. Accordingly, the whole volume occupied by the speaker may be designed to be small compared to the mounting spaces for the other elements. In this case, the volume for a passage for sounds output from the speaker becomes smaller such that the sound quality of the electronic device may deteriorate.

SUMMARY

According to an aspect of the present disclosure, an electronic device that may improve the sound quality of a speaker by utilizing a structural space formed due to a change of the shape of a flexible housing is provided.

In accordance with an aspect of the present disclosure, an electronic device includes a foldable housing including a first surface facing a first direction, a second surface facing a second direction that is opposite to the first direction, and a side surface surrounding a portion of a space between the first surface and the second surface; and a speaker disposed inside the housing. The housing further includes a first speaker hole formed in a partial area of the side surface, which is adjacent to the speaker; and a second speaker hole formed in a partial area of the first surface, which is adjacent to the speaker. The first speaker hole is opened and the second speaker hole is closed in a state in which the housing is unfolded. The first speaker hole is closed and the second speaker hole is opened in a state in which the housing is folded.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers may be used to depict the same or similar elements, features, and structures.

DETAILED DESCRIPTION

Figure 1A:
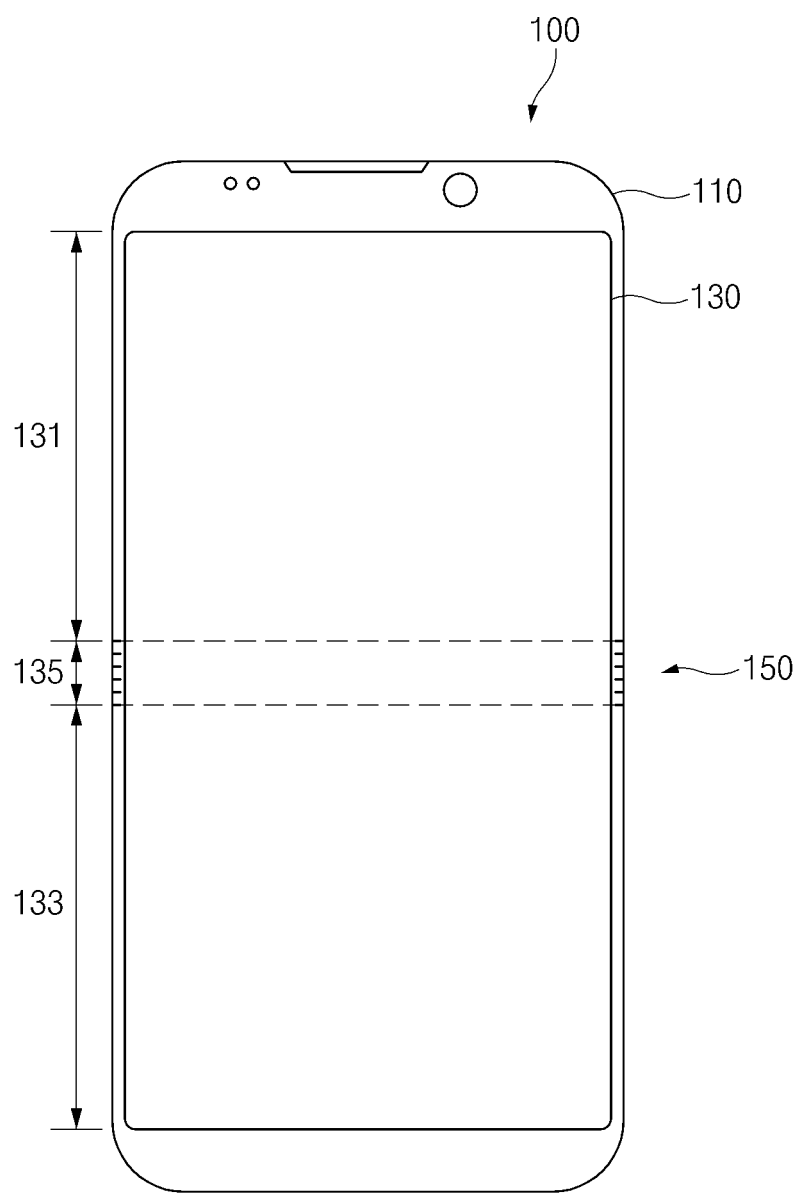
FIG. 1A is a front view of an electronic device according to an embodiment of the present disclosure.

The present disclosure is not intended to be limited by the various embodiments of the present disclosure to a specific embodiment, and it is intended that the present disclosure covers all modifications, equivalents, and/or alternatives of the present disclosure provided they come within the scope of the appended claims and their equivalents. The terms and words used in the following description and claims are not limited to their dictionary meanings, but are merely used to enable a clear and consistent understanding of the present disclosure. Accordingly, it should be apparent to those skilled in the art that the following description of various embodiments of the present disclosure is provided for illustration purposes only and not for the purpose of limiting the present disclosure as defined by the appended claims and their equivalents.

It is to be understood that the singular forms "a", "an", and "the" include plural referents unless the context clearly dictates otherwise. Thus, for example, reference to "a component surface" includes reference to one or more of such surfaces.

The terms "include", "comprise", "have", "may include", "may comprise", and "may have" used herein indicate disclosed functions, operations, or existence of elements, but do not exclude other functions, operations, or elements.

For example, the expressions "A or B," or "at least one of A and/or B" may indicate A and B, A, or B. For instance, the expression "A or B" or "at least one of A and/or B" may indicate (1) at least one A, (2) at least one B, or (3) both at least one A and at least one B.

The terms such as "1st", "2nd", "first", "second", and the like used herein may refer to modifying different elements of various embodiments of the present disclosure, but are not intended to limit the elements. For instance, "a first user device" and "a second user device" may indicate different users regardless of order or importance. For example, a first component may be referred to as a second component and vice versa without departing from the scope and spirit of the present disclosure.

In various embodiments of the present disclosure, it is intended that when a component (e.g., a first component) is referred to as being "operatively or communicatively coupled with/to" or "connected to" another component (e.g., a second component), the component may be directly connected to the other component or connected through another component (e.g., a third component). It is intended that when a component (e.g., a first component) is referred to as being "directly connected to" or "directly accessed" another component (e.g., a second component), another component (e.g., a third component) does not exist between the component (e.g., the first component) and the other component (e.g., the second component).

The expression "configured to" used in various embodiments of the present disclosure may be interchangeably used with "suitable for", "having the capacity to", "designed to", "adapted to", "made to", or "capable of" according to the situation. The term "configured to" may not necessarily indicate "specifically designed to" in terms of hardware. Instead, the expression "a device configured to" in some situations may indicate that the device and another device or part are "capable of." For example, the expression "a processor configured to perform A, B, and C" may indicate a dedicated processor (e.g., an embedded processor) for performing a corresponding operation or a general purpose processor (e.g., a central processing unit (CPU), or application processor (AP)) for performing corresponding operations by executing at least one software program stored in a memory device.

Terms used in various embodiments of the present disclosure are used to describe certain embodiments of the present disclosure, but are not intended to limit the scope of other embodiments. The terms of a singular form may include plural forms unless they have a clearly different meaning in the context. Otherwise, all terms used herein may have the same meanings that are generally understood by a person skilled in the art. In general, terms defined in a dictionary should be considered to have the same meanings as the contextual meaning of the related art, and unless clearly defined herein, should not be understood differently or as having an excessively formal meaning. In any case, even terms defined in the present disclosure are not intended to be interpreted as excluding embodiments of the present disclosure.

An electronic device according to various embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit)

In various embodiments of the present disclosure, an electronic device may be a home appliance. The smart home appliance may include at least one of a television (TV), a digital versatile disc (DVD) player, an audio, a refrigerator, an air conditioner, a cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ or PlayStation™), an electronic dictionary, an electronic key, a camcorder, or an electronic picture frame In various embodiments of the present disclosure, an electronic device may include at least one of medical devices (e.g., portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device, or an Internet of things (IoT) device (e.g., a light bulb, sensors, an electric or gas meter, a sprinkler, a fire alarm, a thermostat, a streetlamp, a toaster, exercise equipment, a hot water tank, a heater, a boiler, or the like).

According to embodiments of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device may be a flexible device. An electronic device is not limited to the above-mentioned devices, and may include new electronic devices with the development of new technology.

The term "user" used herein may refer to a person who uses an electronic device or may refer to a device (e.g., an artificial intelligence electronic device) that uses an electronic device.

Figure 1B:
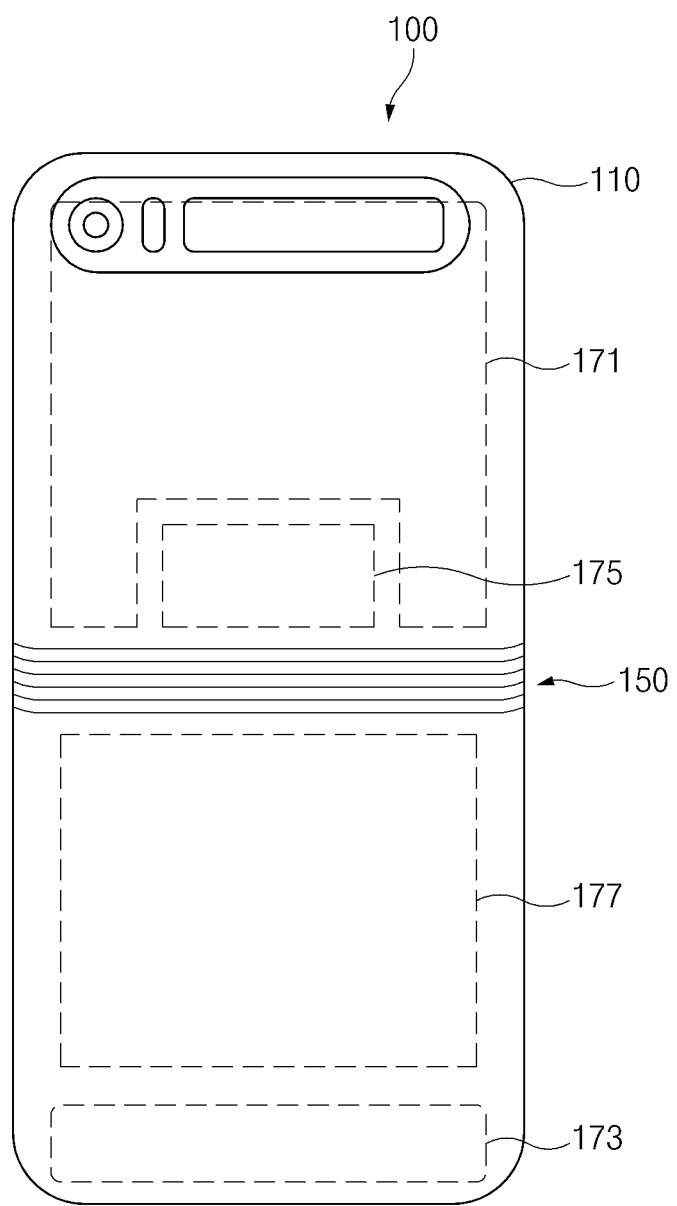
FIG. 1B is a rear view of an electronic device according to an embodiment of the present disclosure.
Figure 1C:
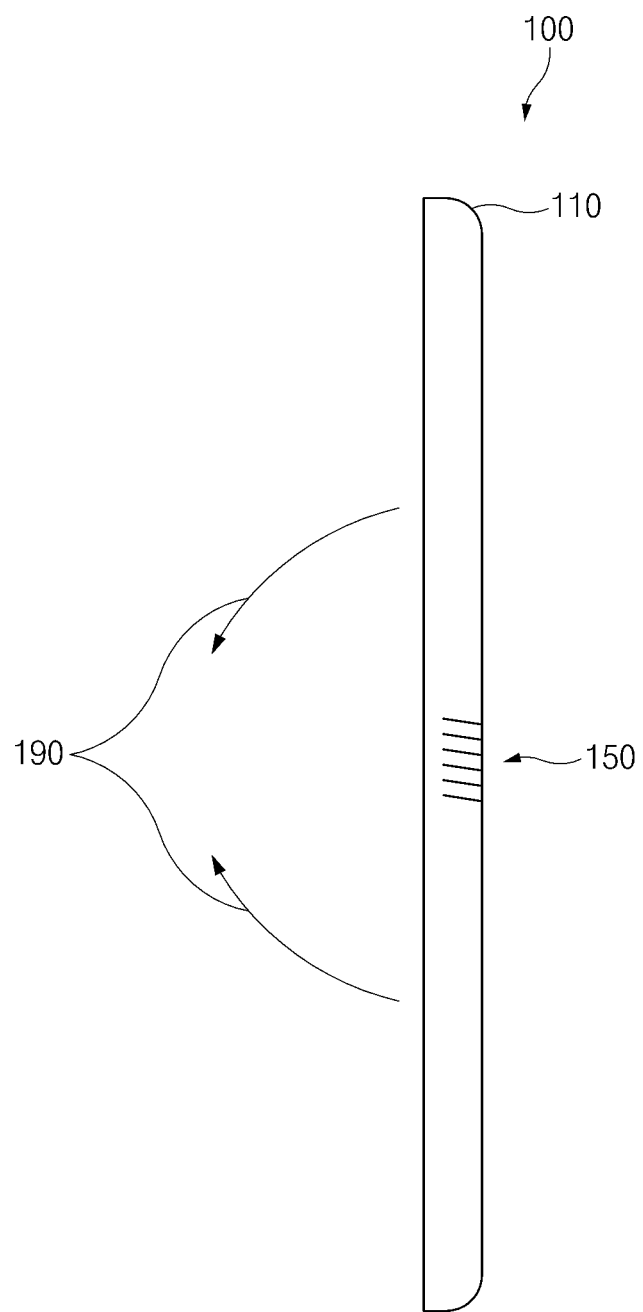
FIG. 1C is a side view of an electronic device according to an embodiment of the present disclosure.
Figure 1D:
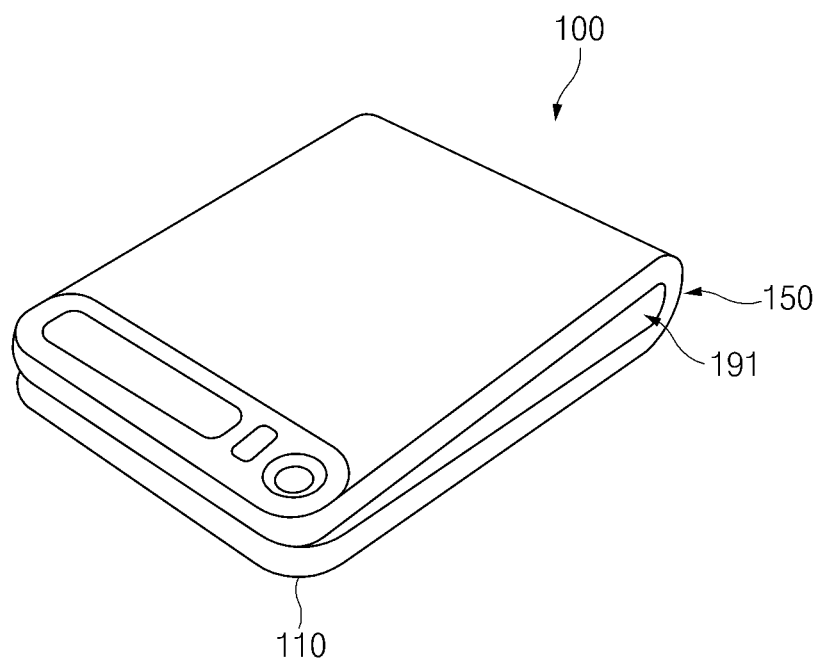
FIG. 1D is a perspective view of an electronic device in a folded state according to an embodiment of the present disclosure.
Figure 1E:
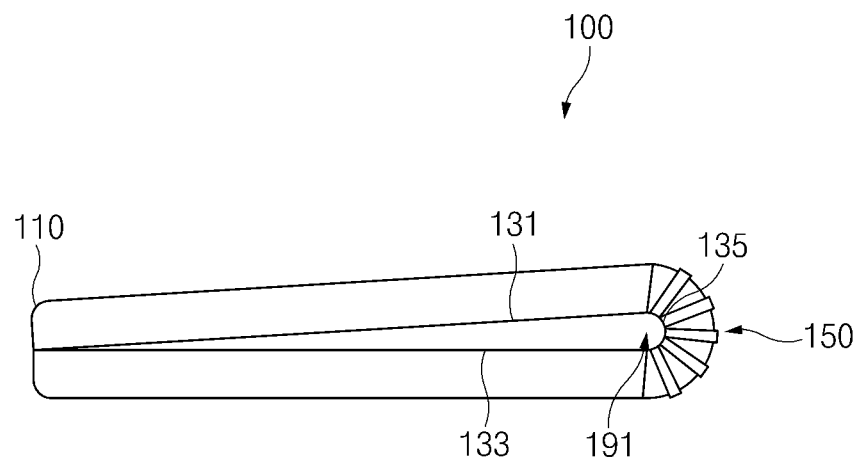
FIG. 1E is a side view of an electronic device in a folded state according to an embodiment of the present disclosure.

FIG. 1A is a front view of an electronic device according to an embodiment of the present disclosure. FIG. 1B is a rear view of an electronic device according to an embodiment of the present disclosure. FIG. 1C is a side view of an electronic device according to an embodiment of the present disclosure. FIG. 1D is a perspective view of an electronic device in a folded state according to an embodiment of the present disclosure. FIG. 1E is a side view of an electronic device in a folded state according to an embodiment of the present disclosure.

Referring to FIGS. 1A to 1E, the electronic device 100 may include a housing 110, and a display 130. The housing 110 may include a front surface, a rear surface, and a side surface partially surrounding a space between the front surface and the rear surface. The side surface refers to a surface that may be visually viewed when a thin surface of the electronic device 100 is viewed, the front surface refers to a surface corresponding to an area except for the side surface and through which a screen output through the display 130 is exposed to the outside, and the rear surface refers to a surface that is opposite to the front surface. Although a partial screen of the display 130 may be exposed to the outside through the rear surface and/or the side surface in some embodiments of the present disclosure, the front surface may be configured such that almost all areas of the front surface may output the screen of the display 130, unlike the rear surface and/or the side surface.

According to an embodiment of the present disclosure, the housing 110 may fix and support the internal elements of the electronic device 100. For example, the housing 110 may provide a space in which the display 130, a printed circuit board (e.g., a first printed circuit board 171, and a second printed circuit board 173), a speaker 175 or a receiver, a battery 177, and the like may be seated, and may support the seated elements.

Various electronic components can be mounted on the printed circuit board. For example, at least one electronic element, circuit lines, or the like may be mounted on the printed circuit board, and at least some of them may be electrically connected to each other. The electronic components may include a processor, a memory, and a communication module (e.g., a communication circuit). Although as shown the electronic device 100 includes the first printed circuit board 171 and the second printed circuit board 173, the present disclosure is not limited thereto. In some embodiments of the present disclosure, one of the first printed circuit board 171 or the second printed circuit board 173 may be omitted in the electronic device 100, and the electronic device 100 may further include at least one other printed circuit board. Further, although it is shown that the first printed circuit board 171 and the second printed circuit board 173 are separately disposed, the first printed circuit board 171 and the second printed circuit board 173 may be electrically connected to each other and may be integrally formed.

The speaker 175 may output sound as an audio output device. For example, the speaker 175 may send sound waves into the air by converting an electrical signal into vibration. According to an embodiment of the present disclosure, the speaker 175 may be mounted on the printed circuit board, and may be disposed physically separate from the printed circuit board and electrically connected to the printed circuit board. Although it is shown that the speaker 175 is disposed adjacent to the first printed circuit board 171, the present disclosure is not limited thereto. The speaker 175 may be disposed adjacent to the second printed circuit board 173, or may be mounted on the second printed circuit board 173. For example, the speaker 175 may be disposed at a central portion of the housing 110, and may be disposed at a lower end of the housing 110.

The battery 177 may supply electric power to the electronic device 100. For example, the battery 177 may be electrically connected to the printed circuit board to supply electric power to the electronic components mounted on the printed circuit board. According to an embodiment of the present disclosure, the battery 177 may be integrally formed with the electronic device 100, or may be detachably mounted on the electronic device 100.

According to an embodiment of the present disclosure, the housing 110 may include a flexible housing. For example, the housing 110 may be bent, folded, or rolled. The housing 110 may include a hinge unit 150. The hinge unit 150 may perform a hinge operation 190, and the housing 110 may be folded through the hinge operation 190 of the hinge unit 150.

According to an embodiment of the present disclosure, when the housing 110 is folded through the hinge operation 190 of the hinge unit 150, the display 130 seated in the housing 110 may also be folded. If the display 130 is folded, as illustrated in FIGS. 1D and 1E, an upper side 131 and a lower side 133 of the display 130 may face each other. Further, an end of the upper side 131 and an end of the lower side 133 of the display 130 may contact each other. In this case, a space 191 may be formed between two of the upper side 131, the lower side 133, and the central portion 135 of the display 130.

The display 130 may display various contents (e.g., a text, an image, a video, an icon, and a symbol). The display 130 may include a liquid crystal display (LCD), a light emitting diode (LED) display, an organic light emitting diode (OLED) display, a microelectromechanical system (MEMS) display, or an electronic paper display. The display 130 may include a touch screen, and receive a touch, a gesture, a proximity, or a hovering input using an electronic pen or the user's body. According to an embodiment of the present disclosure, the display 130 may include a flexible display.

Figure 2A:
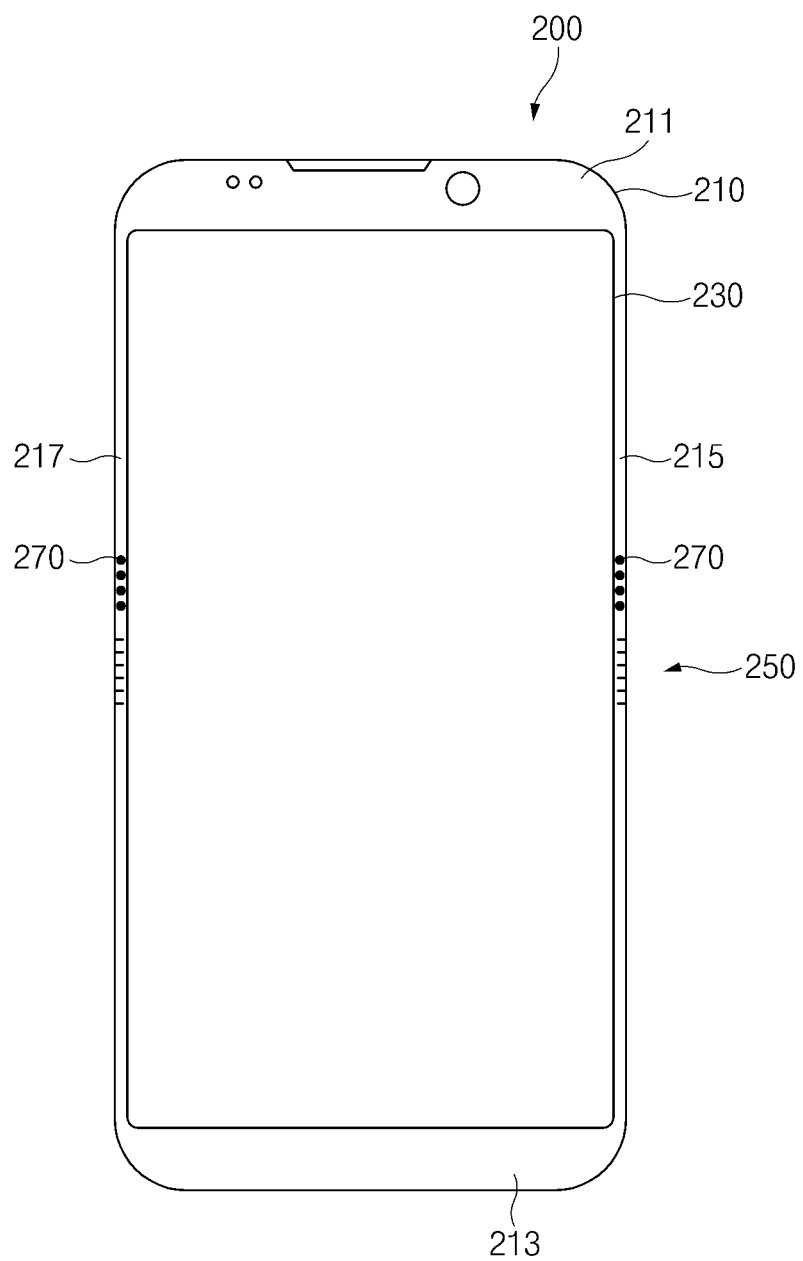
FIG. 2A is a front view of an electronic device illustrating a speaker hole according to an embodiment of the present disclosure.
Figure 2B:
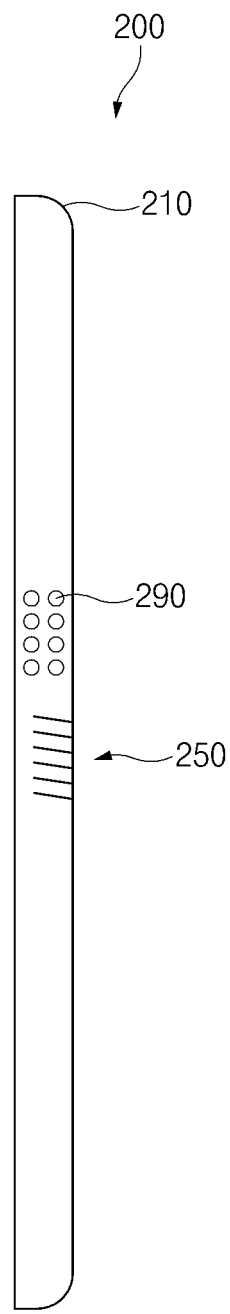
FIG. 2B is a side view of an electronic device illustrating a speaker hole according to an embodiment of the present disclosure.
Figure 2C:
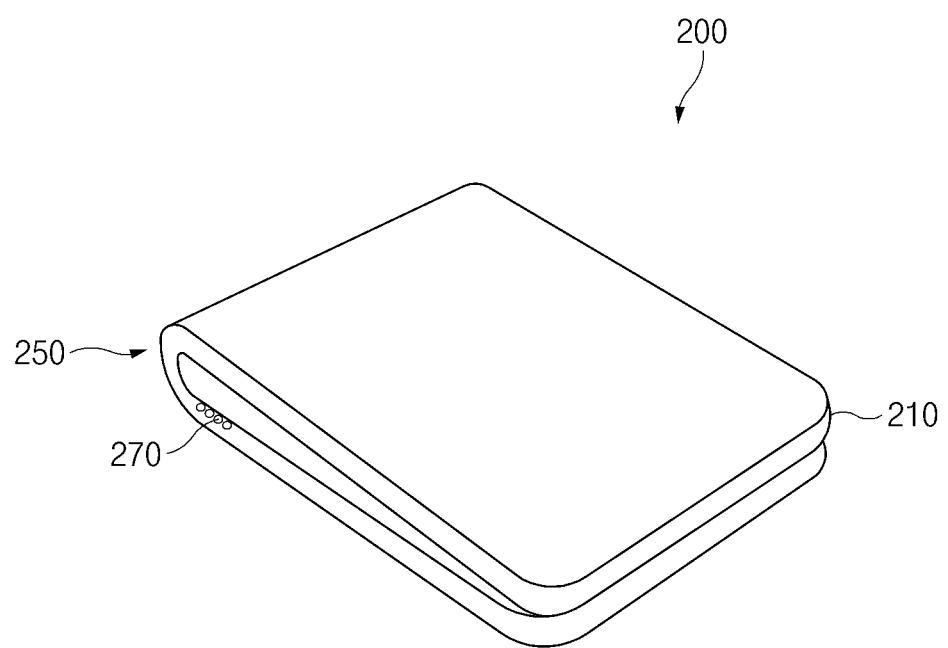
FIG. 2C is a perspective view of an electronic device in a folded state, illustrating a speaker hole according to an embodiment of the present disclosure.
Figure 2D:
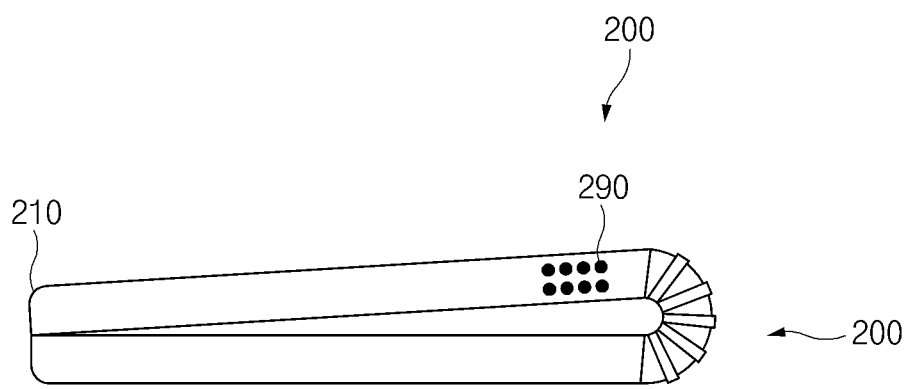
FIG. 2D is a side view of an electronic device in a folded state, illustrating a speaker hole according to an embodiment of the present disclosure.

FIG. 2A is a front view of an electronic device illustrating a speaker hole according to an embodiment of the present disclosure. FIG. 2B is a side view of an electronic device illustrating a speaker hole according to an embodiment of the present disclosure. FIG. 2C is a perspective view of an electronic device in a folded state, illustrating a speaker hole according to an embodiment of the present disclosure. FIG. 2D is a side view of an electronic device in a folded state, illustrating a speaker hole according to an embodiment of the present disclosure.

Referring to FIGS. 2A to 2D, the electronic device 200 may include a housing 210, and a display 230. The electronic device 200 illustrated in FIGS. 2A to 2D may have a configuration that is the same as or similar to that of the electronic device 100 illustrated in FIGS. 1A to 1E. In the following description, the same or similar elements of the above-mentioned electronic device 100 will be omitted.

The housing 210 may provide a space, in which the display 230 may be seated, and may fix and support the seated display 230. A screen of the display 230 may be exposed through the front surface of the housing 210. According to an embodiment of the present disclosure, the front surface of the housing 210 may include a bezel surrounding the display 230. The bezel may include an upper end bezel 211, a lower end bezel 213, a right end bezel 215, and a left end bezel 217. The upper end bezel 211, the lower end bezel 213, the right end bezel 215, and the left end bezel 217 may be disposed adjacent to an upper end, a lower end, a right end, and a left end of the screen of the display 230, respectively. However, the configuration of the bezel is not limited thereto. At least one of the upper end bezel 211, the lower end bezel 213, the right end bezel 215, and the left end bezel 217 may be omitted.

According to an embodiment of the present disclosure, the housing 210 may include a hinge unit 250. The hinge unit 250 may perform a hinge operation thus enabling the housing 210 to be folded. When the housing 210 is folded through the hinge operation of the hinge unit 250, the display 230 seated in the housing 210 may also be folded. If the display 230 is folded, an upper side and a lower side of the display 230 may face each other. Further, an end of the upper side and an end of the lower side of the display 230 may contact each other. In this case, a space may be formed between two of the upper side, the lower side, and the central portion of the display 230. As another example, when the housing 210 is folded through the hinge operation of the hinge unit 250, the upper end bezel 211 and the lower end bezel 213 of the housing 210 may contact each other while the upper end and the lower end of the display 230 do not contact each other, as shown in FIGS. 2C and 3D.

According to an embodiment of the present disclosure, a first speaker hole 290 may be formed on a side surface of the housing 210, as shown in FIG. 2B. The first speaker hole 290 may be connected to a speaker such that sound output through the speaker may be output to the outside. The first speaker hole 290 may be opened in a state in which the housing 210 is unfolded as in FIG. 2B, and may be closed in a state in which the housing 210 is folded as in FIG. 2D.

According to an embodiment of the present disclosure, a second speaker hole 270 may be formed in at least one of the right end bezel 215 and the left end bezel 217 of the housing 210, as shown in FIG. 2A. The second speaker hole 270 may be closed in a state in which the housing 210 is unfolded as in FIG. 2A and may be opened in a state in which the housing 210 is folded as in FIG. 2C. As the second speaker hole 270 formed on the front surface of the housing 210 is opened while the housing 210 is folded, sound output from the speaker may be introduced into a space (e.g., a space 191 in FIGS. 1D and 1E) formed while the housing 210 is folded. The space may be utilized as a passage for the introduced sound, and as a result, the volume of the passage for the sound increases such that the sound quality of the speaker may be improved.

Figure 3:
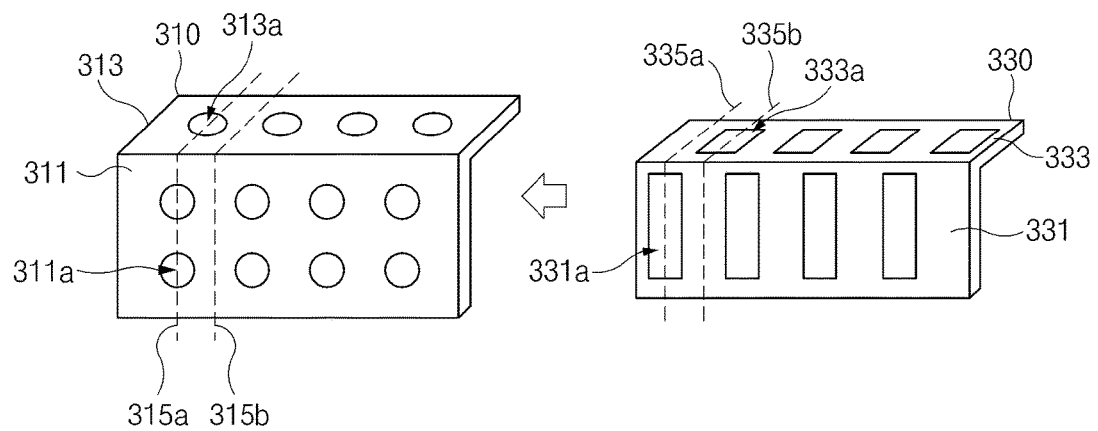
FIG. 3 is a view illustrating an opening/closing structure of a speaker hole according to an embodiment of the present disclosure.

FIG. 3 is a view illustrating an opening/closing structure of a speaker hole according to an embodiment of the present disclosure.

Referring to FIG. 3, a speaker hole may be formed in the housing 310. One or more first speaker holes 311a may be formed on a side surface 311 of the housing 310, and one or more second speaker holes 313a may be formed on a front surface 313 of the housing 310. According to an embodiment of the present disclosure, the second speaker holes 313a formed on the front surface 313 of the housing 310 may be formed in a bezel area of the front surface 313 of the housing 310. The first speaker holes 311a and the second speaker holes 313a may be arranged on the same line (e.g., a first line 315a) facing a widthwise direction or a transverse direction of the housing 310. Further, a space between the first speaker holes 311a and a space between the second speaker holes 313a may be arranged on the same line (e.g., a second line 315b) facing a widthwise direction of the housing 310.

According to an embodiment of the present disclosure, the first speaker holes 311a and the second speaker holes 313a may be alternately opened and closed. For example, if the first speaker holes 311a are opened, the second speaker holes 313a may be closed, and if the first speaker holes 311a are closed, the second speaker holes 313a may be opened.

According to an embodiment of the present disclosure, a sliding member 330 may be disposed inside the housing 310. The sliding member 330 may be disposed inside an area of the housing 310, in which the first speaker holes 311a and the second speaker holes 313a are formed. The sliding member 330 may slide inside the housing 310. For example, the sliding member 330 may be slid to the lengthwise or longitudinal left and right sides of the housing 310.

One or more first openings 331a may be formed on a first surface 331 of the sliding member 330, which faces a side surface 311 of the housing 310. One or more second openings 333a may be formed on a second surface 333 of the sliding member 330, which faces a front surface 313 of the housing 310. The first openings 331a and the second openings 333a may not be arranged on the same line (e.g., a third line 335a or a fourth line 335b) facing a widthwise direction or a transverse direction of the sliding member 330. The first openings 331a and the second openings 333a may be alternately formed such that the first speaker holes 311a and the second speaker holes 313a formed in the housing 310 are alternately opened and closed when the sliding member 330 is slid inside the housing 310. For example, the first openings 331a may be formed on the third line 335a, and the second openings 333a may be formed on the fourth line 335b that is spaced apart from the third line 335a by a specific distance. Accordingly, if the first openings 331a are aligned with the first speaker holes 311a when the sliding member 330 is slid inside the housing 310, the first speaker holes 311a may be opened and the second speaker holes 313a may be closed. Further, when the second openings 333a are aligned with the second speaker holes 313a, the first speaker holes 311a may be closed and the second speaker holes 313a may be opened.

Figure 4A:
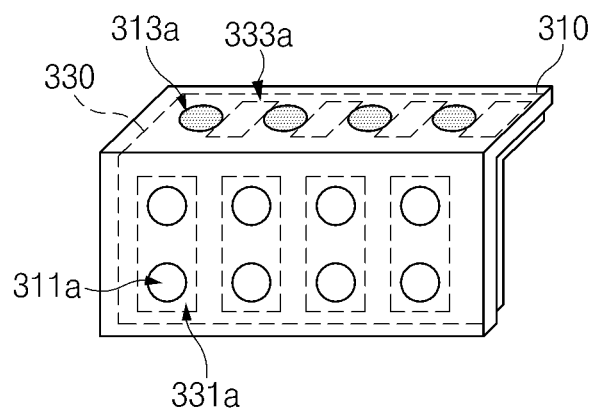
FIG. 4A is a view illustrating a first opening/closing state of a speaker hole according to an embodiment of the present disclosure.
Figure 4B:
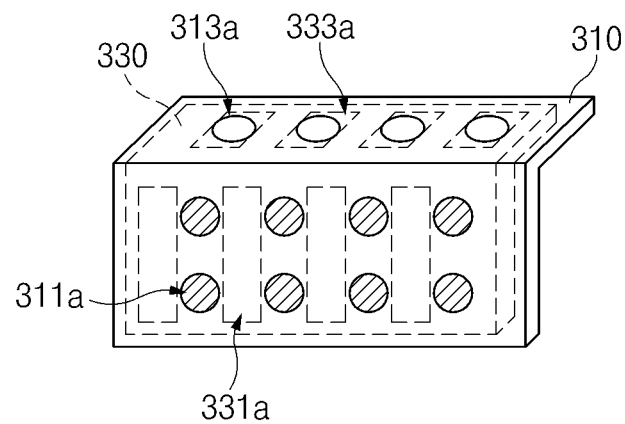
FIG. 4B is a view illustrating a second opening/closing state of a speaker hole according to an embodiment of the present disclosure.

FIG. 4A is a view illustrating a first opening/closing state of a speaker hole according to an embodiment of the present disclosure. FIG. 4B is a view illustrating a second opening/closing state of a speaker hole according to an embodiment of the present disclosure.

Referring to FIGS. 4A and 4B, when the sliding member 330 is slid inside the housing 310, the first speaker holes 311a and the second speaker holes 313a formed in the housing 310 may be alternately opened and closed. For example, as illustrated in FIG. 4A, the first openings 331a formed on the first surface 331 of the sliding member 330 are aligned with the first speaker holes 311a formed on the side surface 311 of the housing 310, the first speaker holes 311a may be opened and the second speaker holes 313a that are not aligned with the second openings 333a may be closed. Further, as illustrated in FIG. 4B, the second openings 333a formed on the second surface 333 of the sliding member 330 are aligned with the second speaker holes 313a formed on the front surface 313 of the housing 310, the second speaker holes 313a may be opened and the first speaker holes 311a that are not aligned with the first openings 331a may be closed.

Figure 5A:
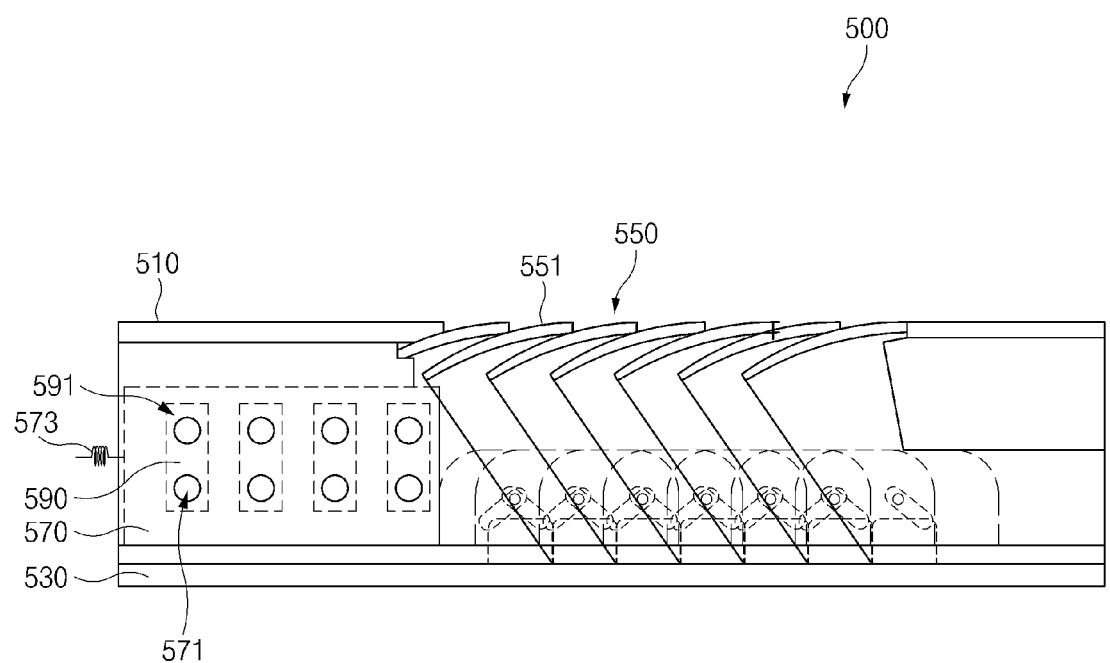
FIG. 5A is a view illustrating an opening/closing state of a speaker hole in a state in which an electronic device is unfolded, according to an embodiment of the present disclosure.
Figure 5B:
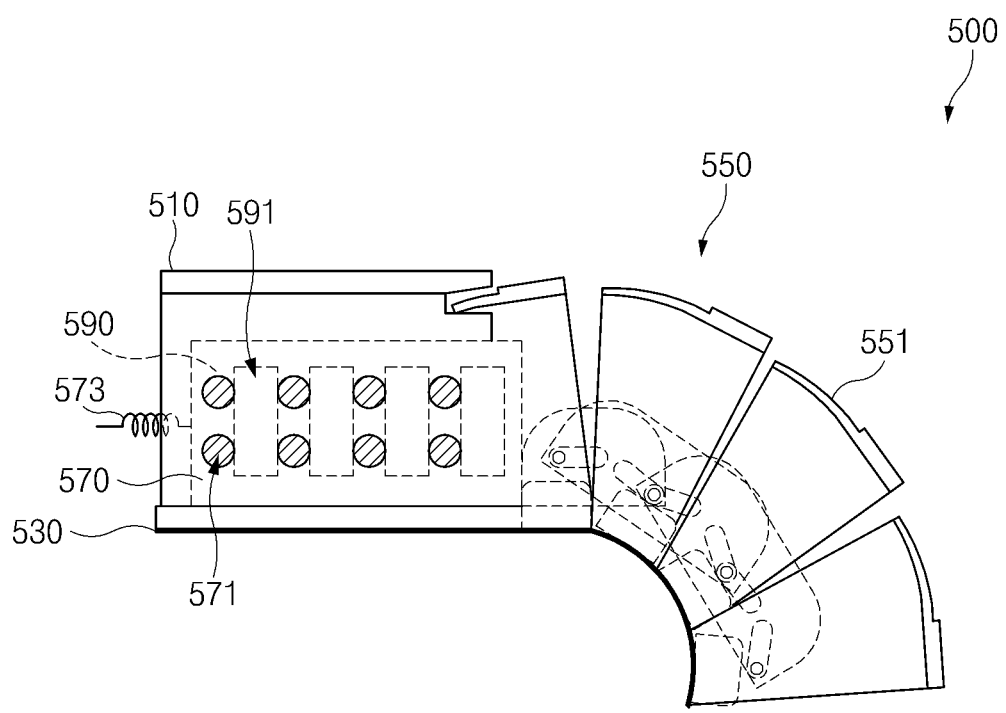
FIG. 5B is a view illustrating an opening/closing state of a speaker hole in a state in which an electronic device is folded, according to an embodiment of the present disclosure.

FIG. 5A is a view illustrating an opening/closing state of a speaker hole in a state in which an electronic device is unfolded, according to an embodiment of the present disclosure. FIG. 5B is a view illustrating an opening/closing state of a speaker hole in a state in which an electronic device is folded, according to an embodiment of the present disclosure.

Referring to FIGS. 5A to 5B, the electronic device 500 may include a housing 510 and a display 530. A speaker hole 571 formed on a side surface 570 of the housing 510 may be opened and closed by a sliding member 590 that slides inside a side surface 570 of the housing 510. For example, when the sliding member 590 is slid, the speaker hole 571 may be opened if an opening 591 formed on one surface of the sliding member 590 is aligned with the speaker hole 571 and the speaker hole 571 may be closed if a space between the openings 591 is positioned at a location that is aligned with the speaker hole 571.

According to an embodiment of the present disclosure, the sliding member 590 may be slid by an elastic member 573 (e.g., a spring) disposed inside the housing 510. For example, as illustrated in FIG. 5A, the elastic member 573 maintains its original shape in a state in which hinge members 551 included in a hinge unit 550 of the housing 510 are arranged in a row in a state in which the housing 510 is unfolded, and in this case, the opening 591 formed on one surface of the sliding member 590 may be positioned at a location that is aligned with the speaker hole 571. As another example, as illustrated in FIG. 5B, the elastic member 573 is extended by a specific length in a state in which hinge members 551 included in a hinge unit 550 of the housing 510 are arranged in a curved form in a state in which the housing 510 is folded, and in this case, a space between the openings 591 of the sliding member 590 may be positioned at a location that is aligned with the speaker hole 571. As a result, the opening 591 of the sliding member 590 may be aligned with the speaker hole 571 and the speaker hole 571 may be opened in a state in which the housing 510 is unfolded, and a space between the openings 591 of the sliding member 590, that is, an unopened part may be aligned with the speaker hole 571 and the speaker hole 571 may be closed in a state in which the housing 510 is folded.

Figure 6:
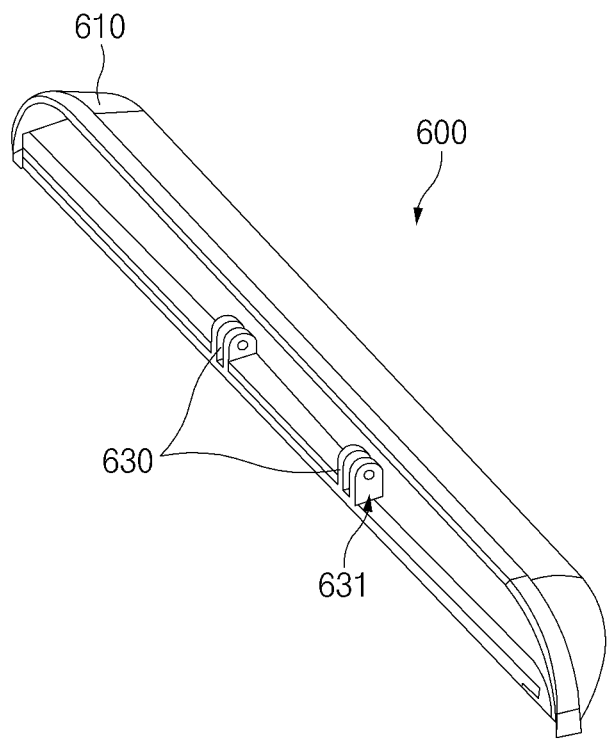
FIG. 6 is a perspective view of a hinge member according to an embodiment of the present disclosure.

FIG. 6 is a perspective view of a hinge member according to an embodiment of the present disclosure.

According to an embodiment of the present disclosure, a housing 110 of an electronic device 100 may include a hinge unit 150 or 550. The hinge unit may enable the housing to be folded by a hinge operation of the hinge unit. The hinge unit may include a plurality of hinge members 600.

During a hinge operation of the hinge unit, an arrangement direction of the hinge members 600 may be changed, and the housing may be unfolded or folded according to the arrangement direction of the hinge members 600. For example, if the hinge members 600 are arranged in a row, the housing may be unfolded. As another example, if the hinge members 600 are arranged in a curved form, the housing may be folded.

Referring to FIG. 6, the hinge member 600 may include a cover 610 and a connector 630. The cover 610 defines an external appearance of the hinge member 600, and when a plurality of hinge members 600 are connected to each other, the covers 610 of the plurality of hinge members 600 may define a portion of a rear surface and a portion of a side surface of the housing. For example, the covers 610 of the plurality of hinge members 600 may be engaged with the adjacent covers 610.

The cover 610 may include a front surface, a rear surface, and a side surface partially surrounding a space between the front surface and the rear surface. According to an embodiment of the present disclosure, the cover 610 may have a shape that is recessed on one surface thereof. For example, the cover 610 may have a dome shape. For example, both the front surface and the rear surface of the cover 610 may protrude towards the front surface.

The connectors 630 may couple the hinge members 600 to the housing. According to an embodiment of the present disclosure, the connectors 630 may be disposed on an inner surface of the hinge member 600. For example, the cover 610 may be recessed, and the connectors 630 may be disposed on an inner surface of the recessed cover 610. The connector 630 may have a hole 631 such that a hinge shaft of the hinge member 600 may be inserted into the hole 631. The hinge member 600 may include one connector 630, and may include a plurality of connectors 630 for a strong coupling force.

Figure 7A:
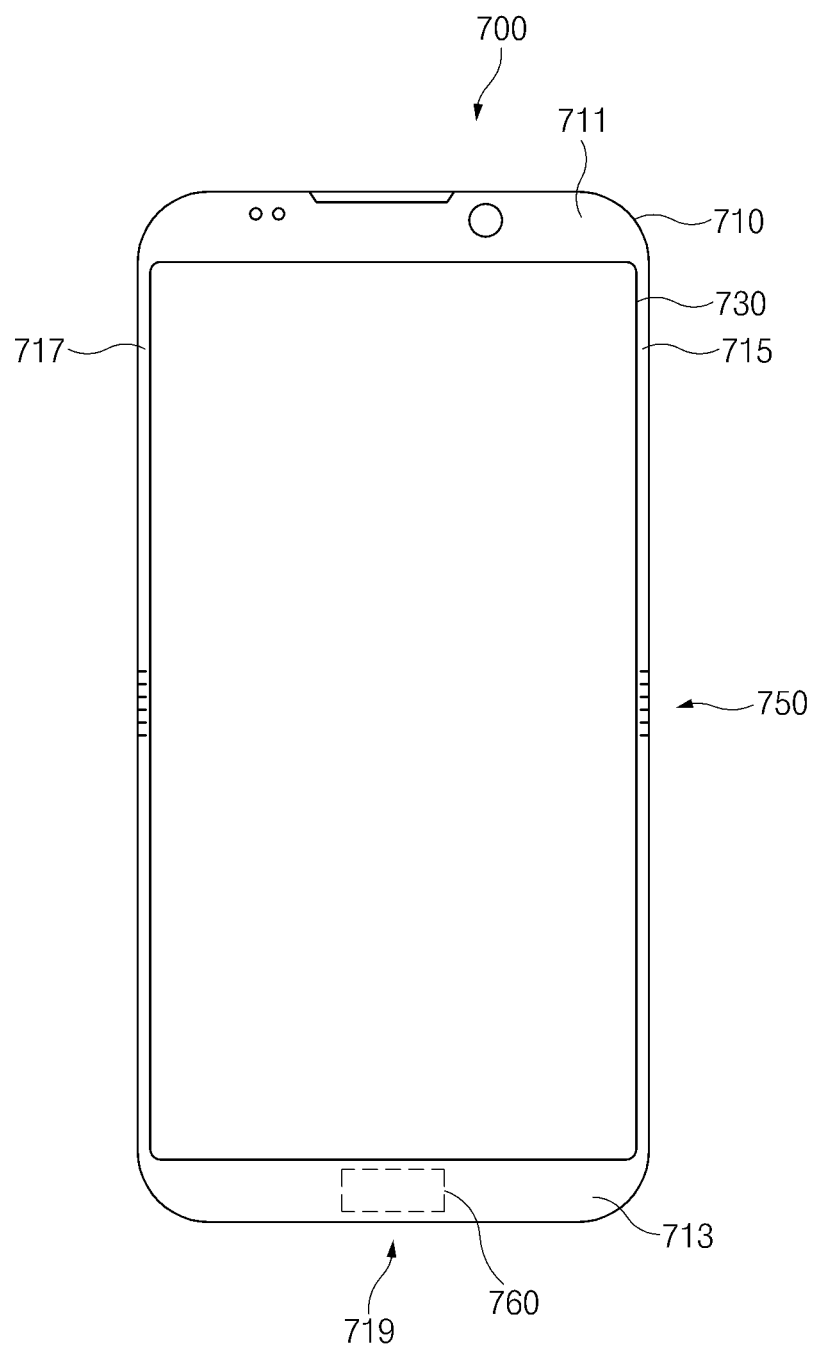
FIG. 7A is a front view of an electronic device that utilizes an aperture between a housing and a display as a speaker hole, according to an embodiment of the present disclosure.
Figure 7B:
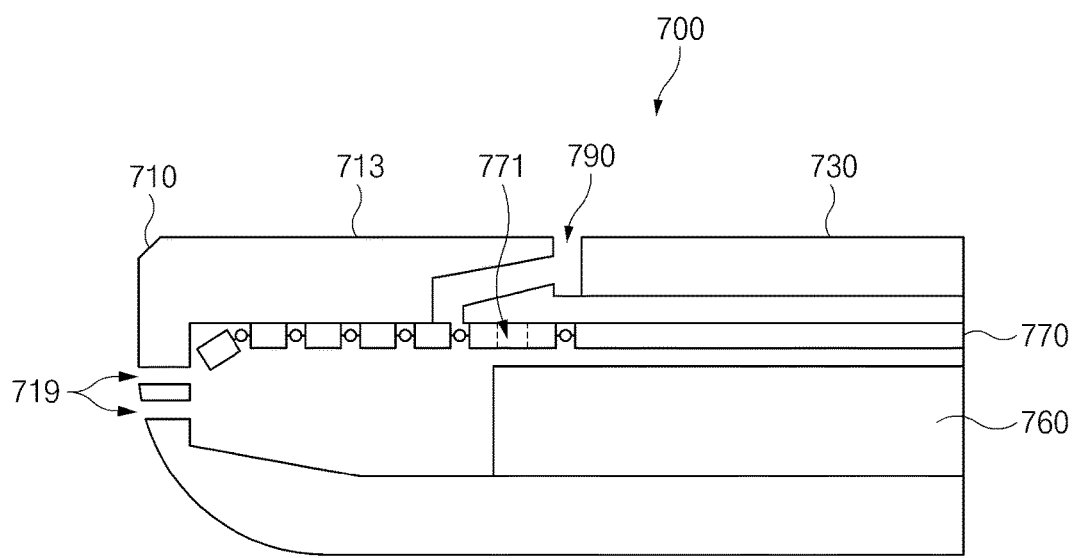
FIG. 7B is a view illustrating an internal structure of the electronic device in a state in which the electronic device illustrated in FIG. 7A is unfolded, according to an embodiment of the present disclosure.
Figure 7C:
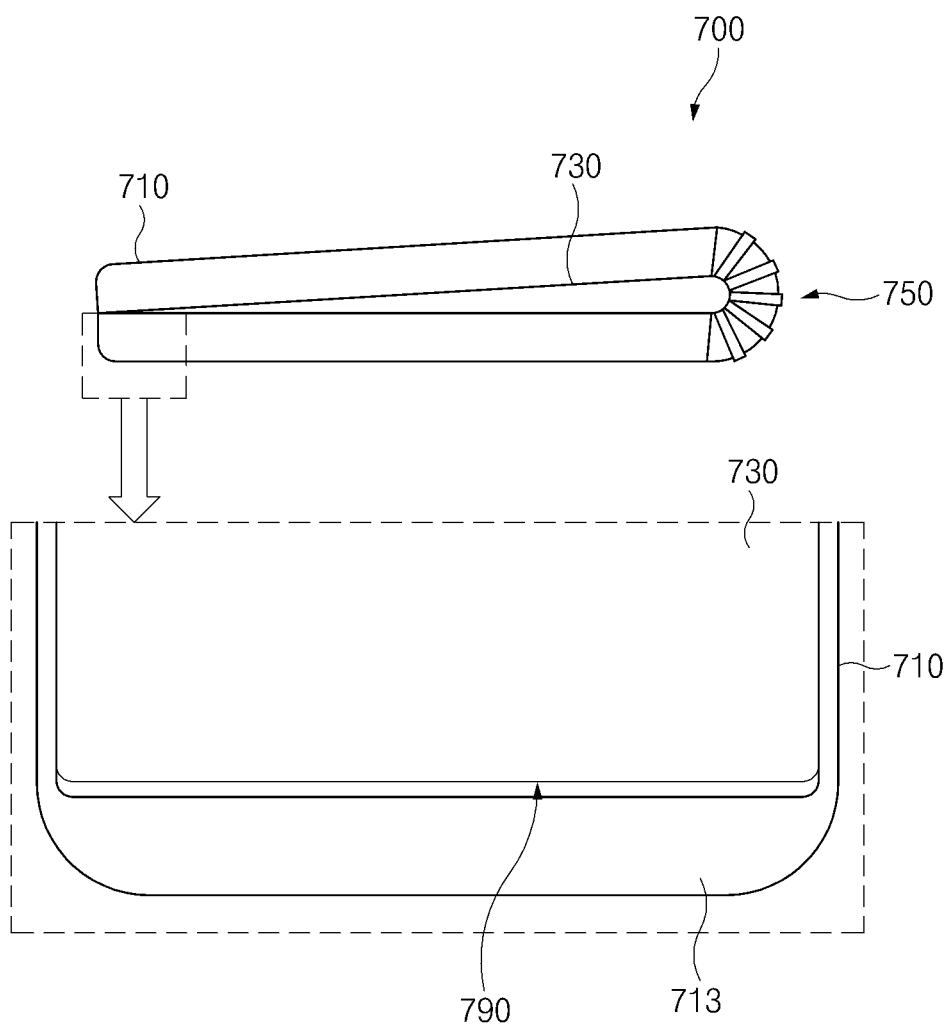
FIG. 7C is a view illustrating a state in which the electronic device illustrated in FIG. 7A is folded, according to an embodiment of the present disclosure.
Figure 7D:
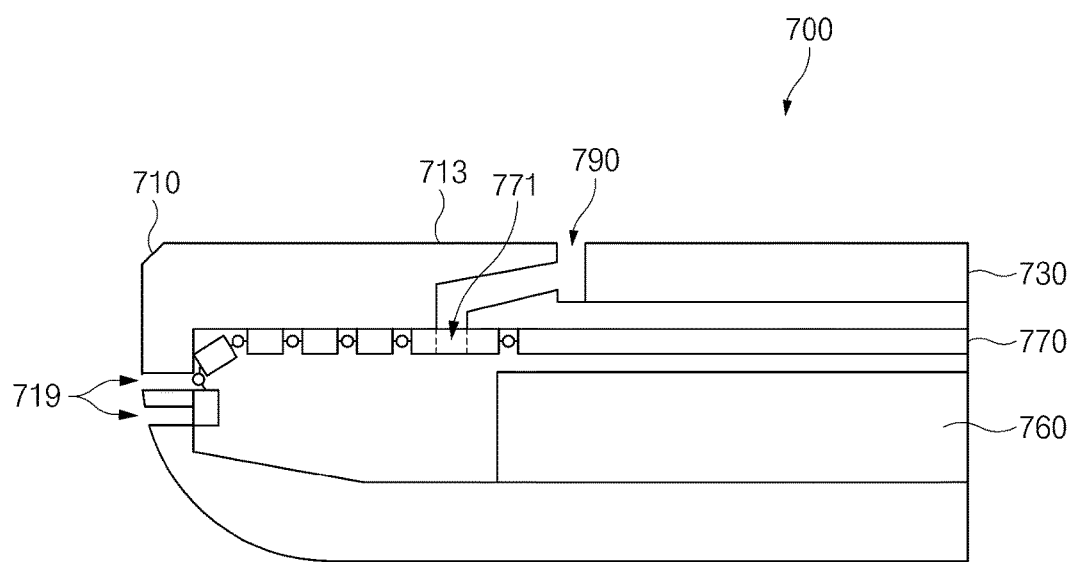
FIG. 7D is a view illustrating an internal structure of the electronic device in a state in which the electronic device illustrated in FIG. 7A is folded, according to an embodiment of the present disclosure.

FIG. 7A is a front view of an electronic device that utilizes an aperture between a housing and a display as a speaker hole, according to an embodiment of the present disclosure. FIG. 7B is a view illustrating an internal structure of the electronic device in a state in which the electronic device illustrated in FIG. 7A is unfolded, according to an embodiment of the present disclosure. FIG. 7C is a view illustrating a state in which the electronic device illustrated in FIG. 7A is folded, according to an embodiment of the present disclosure. FIG. 7D is a view illustrating an internal structure of the electronic device in a state in which the electronic device illustrated in FIG. 7A is folded, according to an embodiment of the present disclosure.

Referring to FIGS. 7A to 7D, and with reference to FIG. 7A, the electronic device 700 may include a housing 710, and a display 730. The housing 710 may include a hinge unit 750, and may be folded or unfolded through a hinge operation of the hinge unit 750. According to an embodiment of the present disclosure, the hinge unit 750 may be disposed on a portion of a side surface and a rear surface of the housing 710 corresponding to a central portion of the housing 710.

According to an embodiment of the present disclosure, the front surface of the housing 710 may include a bezel surrounding the display 730. The bezel may include an upper end bezel 711, a lower end bezel 713, a right end bezel 715, and a left end bezel 717. The upper end bezel 711, the lower end bezel 713, the right end bezel 715, and the left end bezel 717 may be disposed adjacent to an upper end, a lower end, a right end, and a left end of the screen of the display 730, respectively.

According to an embodiment of the present disclosure, when the housing 710 is folded through the hinge operation of the hinge unit 750, the display 730 seated in the housing 710 may also be folded. Further, when the housing 710 is folded through a hinge operation of the hinge unit 750, an upper end bezel 711 and a lower end bezel 713 of the housing 710 may contact each other, as shown in FIG. 7C.

According to an embodiment of the present disclosure, the electronic device 700 may further include a speaker 760 (e.g., the speaker 175). The speaker 760 may be seated inside the housing 710. The speaker 760 may be disposed inside a central portion of the housing (as illustrated in FIG. 1B), and may be disposed inside a lower end of the housing 710 as illustrated in FIG. 7A. When the speaker 760 is disposed inside a lower end of the housing 710, sound may be discharged to the outside through a speaker hole 719 formed on a lower surface of the housing 710.

According to an embodiment of the present disclosure, the speaker hole 719 may be closed by a blocking member 770 in a state in which the housing 710 is folded, as in FIG. 7D. The blocking member 770 may be disposed between the display 730 and the speaker 760. In a state in which the housing 710 is unfolded as illustrated in FIG. 7B, the blocking member 770 may block a passage connecting an aperture 790 formed between the display 730 and the lower end bezel 713 of the housing 710 and the speaker 760, and may open the speaker hole 719 formed on a lower surface of the housing 710. In a state in which the housing 710 is folded as illustrated in FIG. 7D, the blocking member 770 may open a passage connecting the aperture 790 formed between the display 730 and the lower end bezel 713 of the housing 710 and the speaker 760, and may block the speaker hole 719 formed on the lower surface of the housing 710. The blocking member 770 may include a through-hole 771, and may open the passage as the through-hole 771 is positioned at a location that is aligned with the passage in a state in which the housing 710 is folded. As a result, sound output from the speaker 760 is discharged through the speaker hole 719 in a state in which the housing 710 is unfolded, and sound output from the speaker 760 may be discharged through the aperture 790 formed between the lower end bezel 713 of the housing 710 and the display 730 via the through-hole 771 formed in the blocking member 770 and the passage in a state in which the housing 710 is folded. Accordingly, in a state in which the housing 710 is folded, sound output from the speaker 760 is introduced into a space (e.g., the space 191 in FIGS. 1D and 1E) formed in a state in which the housing 710 is folded so that the volume of the passage for sounds is increased by the space and the sound quality of the speaker may be improved.

Figure 8:
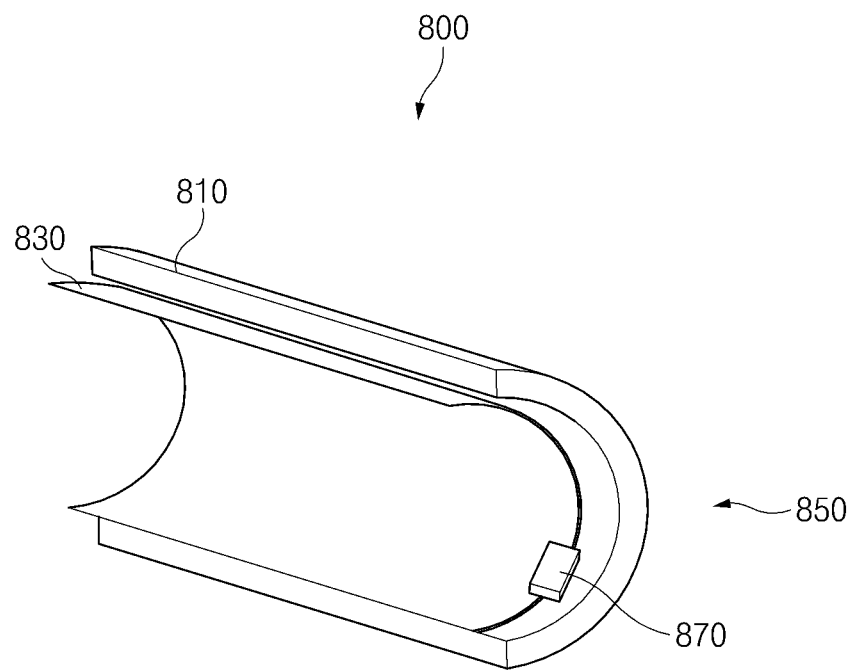
FIG. 8 is a view illustrating an electronic device including a film speaker according to an embodiment of the present disclosure.

FIG. 8 is a view illustrating an electronic device including a film speaker according to an embodiment of the present disclosure.

Referring to FIG. 8, the electronic device 800 may include a film speaker 870. The film speaker 870 may be a portion of the display 830. For example, the film speaker 870 may include a piezoelectric sensor disposed inside the housing 810 and connected to a rear surface of the display 830. The piezoelectric sensor may detect an external force or generate mechanical vibration according to an input voltage by using a property of a piezoelectric element that may convert a voltage into a mechanical input or may convert a mechanical input into a voltage. The film speaker 870 may generate a sound wave by using vibration of the piezoelectric sensor.

Figure 9A:
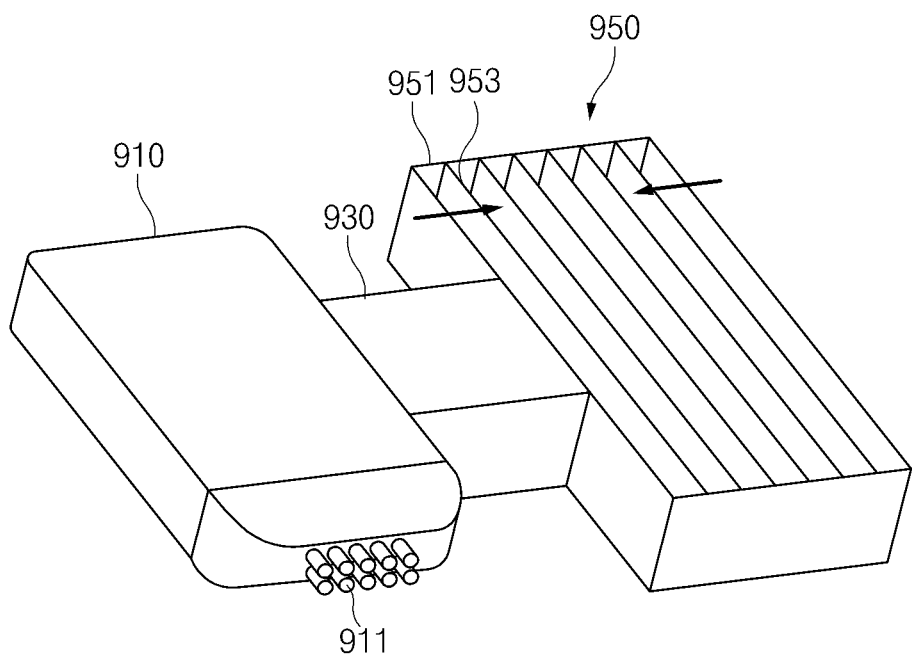
FIG. 9A is a view illustrating a volume of a hinge unit in a state in which an electronic device is unfolded, according to an embodiment of the present disclosure.
Figure 9B:
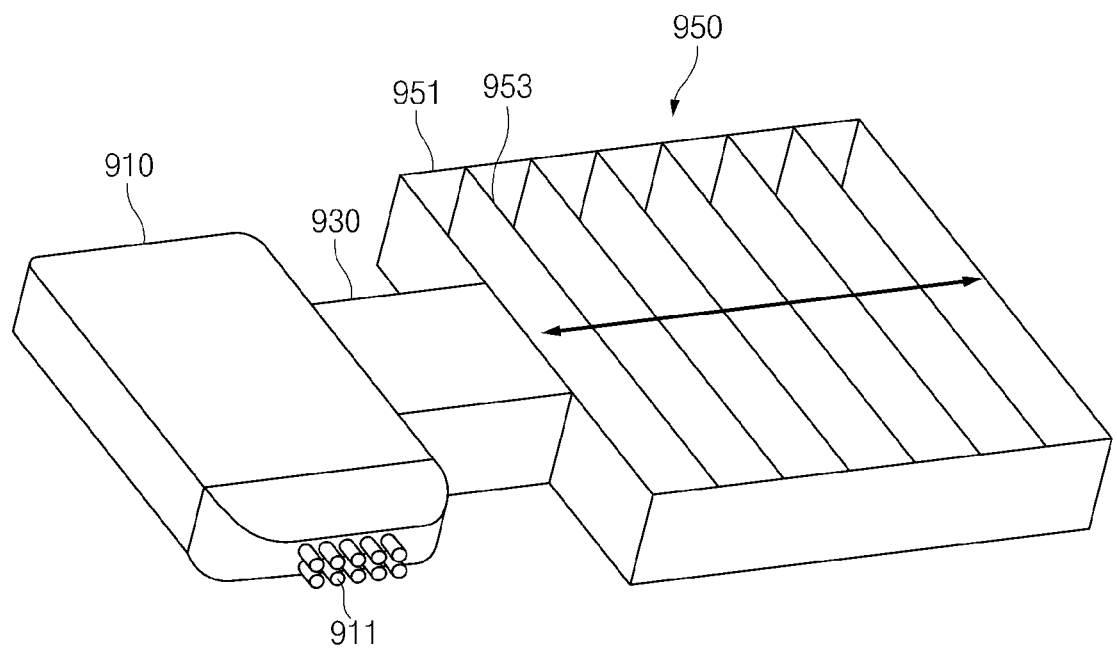
FIG. 9B is a view illustrating a volume of a hinge unit in a state in which an electronic device is folded, according to an embodiment of the present disclosure.
Figure 9C:
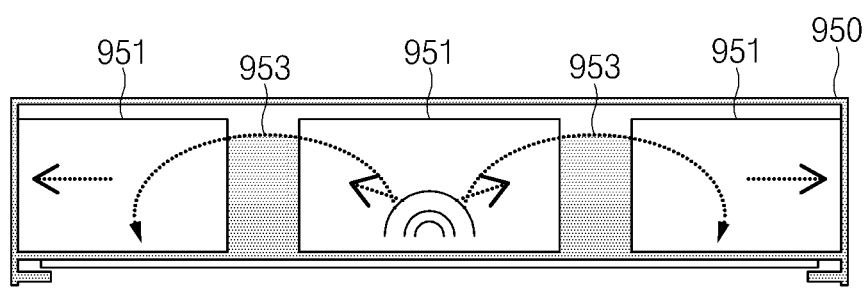
FIG. 9C is a view illustrating a low sound reflecting structure utilizing a hinge unit according to an embodiment of the present disclosure.

FIG. 9A is a view illustrating a volume of a hinge unit in a state in which an electronic device is unfolded, according to an embodiment of the present disclosure. FIG. 9B is a view illustrating a volume of a hinge unit in a state in which an electronic device is folded, according to an embodiment of the present disclosure. FIG. 9C is a view illustrating a low sound reflecting structure utilizing a hinge unit according to an embodiment of the present disclosure.

Referring to FIGS. 9A to 9C, and with reference to FIG. 9A, sound output from a speaker 910 may be discharged through a speaker hole 911. According to an embodiment of the present disclosure, the sound output from the speaker 910 may be introduced into a space (e.g., a back volume) provided to improve sound quality.

According to an embodiment of the present disclosure, a housing 110 of an electronic device 100 may improve the sound quality of the speaker 910 by utilizing a hinge unit 950. If the volume of the hinge unit 950 increases through hinge operations of hinge members 951 included in the hinge unit 950, the sound quality of the speaker 910 may be improved by utilizing a space corresponding to the increased volume as a passage. For example, the sound output from the speaker 910 may be introduced into the spaces defined by the hinge members 951 via a connecting member 930 connecting the speaker 910 and the hinge unit 950.

According to an embodiment of the present disclosure, as illustrated in FIG. 9B, the spaces defined by the hinge members 951 may increase in a state in which the housing is folded, and the sound quality of the speaker 910 may be improved by utilizing the spaces as a low sound reflecting structure or a back volume of the speaker 910.

As illustrated in FIG. 9C, the sound output from the speaker 910 may be delivered from any one of the hinge members 951 to another hinge member 951 via connectors 953 connecting the hinge members 951. As a result, the inside spaces of the hinge members 951 may be utilized as passages for sounds. Accordingly, if the inside spaces of the hinge members 951 are expanded in a state in which the housing is folded, the volumes of the passage for sound also increase, thereby improving the sound quality of the speaker 910.

Figure 10:
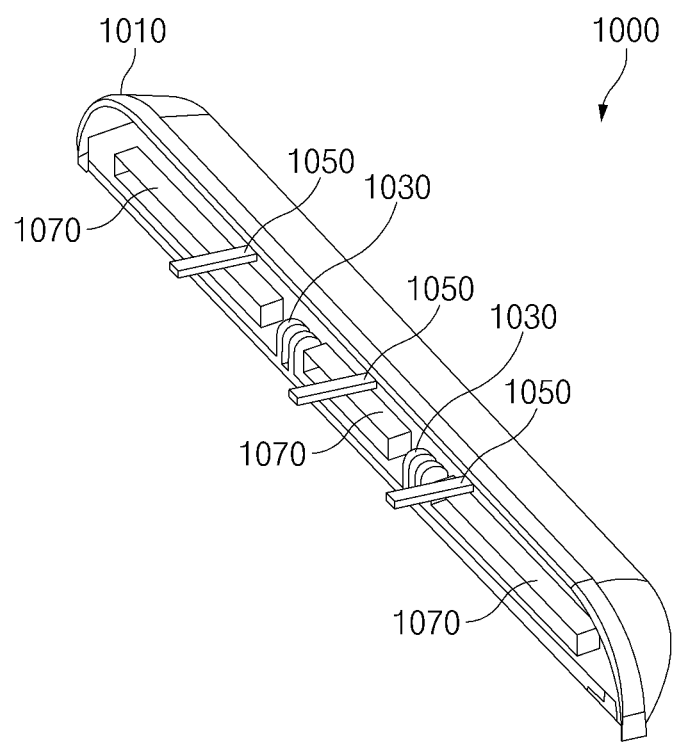
FIG. 10 is a perspective view of a hinge member including a sound leakage preventing member for preventing sound from being leaked, according to an embodiment of the present disclosure.

FIG. 10 is a perspective view of a hinge member including a sound leakage preventing member for preventing sound from being leaked, according to an embodiment of the present disclosure.

Referring to FIG. 10, the hinge member 1000 may include a cover 1010, a connector 1030, a cover connector 1050, and a sound leakage preventing member 1070. The cover 1010 may include a front surface, a rear surface, and a side surface partially surrounding a space between the front surface and the rear surface. According to an embodiment of the present disclosure, the cover 1010 may have a shape that is recessed on one surface thereof. For example, the cover 1010 may have a dome shape. For example, both the front surface and the rear surface of the cover 1010 may protrude towards the front surface.

The connectors 1030 may couple the hinge members 1000 to the housing. According to an embodiment of the present disclosure, the connectors 1030 may be disposed on an inner surface of the hinge member 1000. For example, the cover 1010 may be recessed, and the connectors 1030 may be disposed on an inner surface of the recessed cover 1010. The connector 1030 may have a hole such that a hinge shaft of the hinge member 1000 may be inserted into the hole. The hinge member 1000 may include one connector 1030, and may include a plurality of connectors 1030 for a strong coupling force.

The cover connector 1050 may connect a cover 1010 of one of the hinge members 1000 to a cover 1010 of an adjacent hinge member 1000. According to an embodiment of the present disclosure, the cover connector 1050 may have a shape that protrudes from a side surface of the cover 1010. For example, the cover connector 1050 may protrude from a portion of an upper surface of the cover 1010. The hinge member 1000 may include one cover connector 1050, and may include a plurality of cover connectors 1050 for a strong coupling force between the covers 1010.

When the sound output from the speaker is introduced into the hinge member 1000, the sound leakage preventing member 1070 may prevent the introduced sound from being leaked to the outside. According to an embodiment of the present disclosure, the sound leakage preventing member 1070 may be disposed on an inner surface of the recessed cover 1010. An opening may be formed on a first surface of the sound leakage preventing member 1070, which is disposed in a direction in which the sound output from the speaker is introduced, and a second surface of the sound leakage preventing member 1070, which is opposite to the first surface, may be blocked. Accordingly, the sound output from the speaker may be introduced through the opening formed on the first surface, and the introduced sound may not be leaked because the second surface is blocked.

Figure 11A:
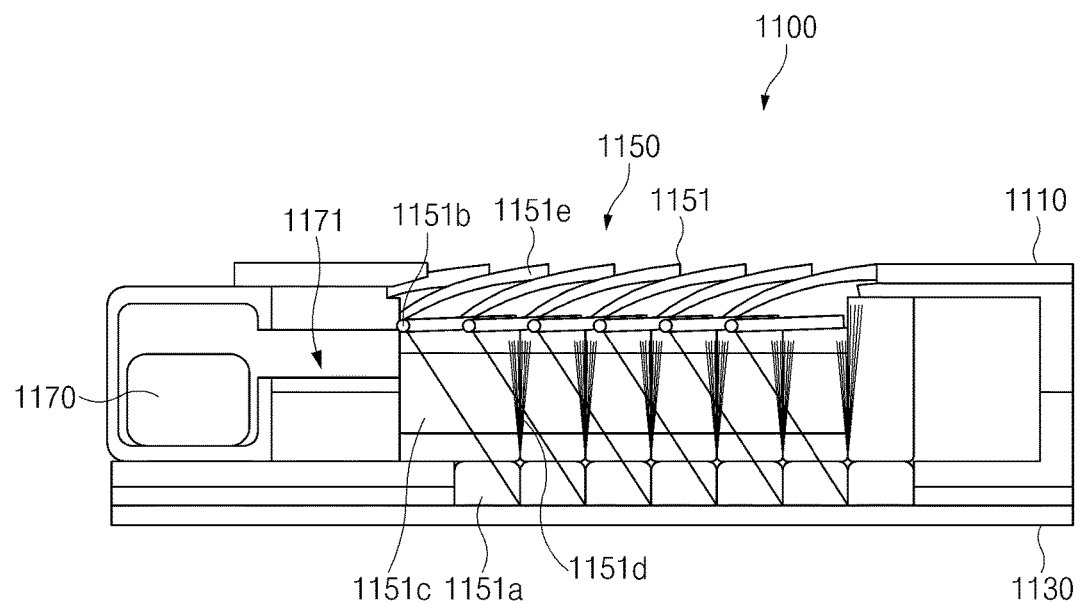
FIG. 11A is a view illustrating a state of the sound leakage preventing member of FIG. 10 in a state in which an electronic device is unfolded, according to an embodiment of the present disclosure.
Figure 11B:
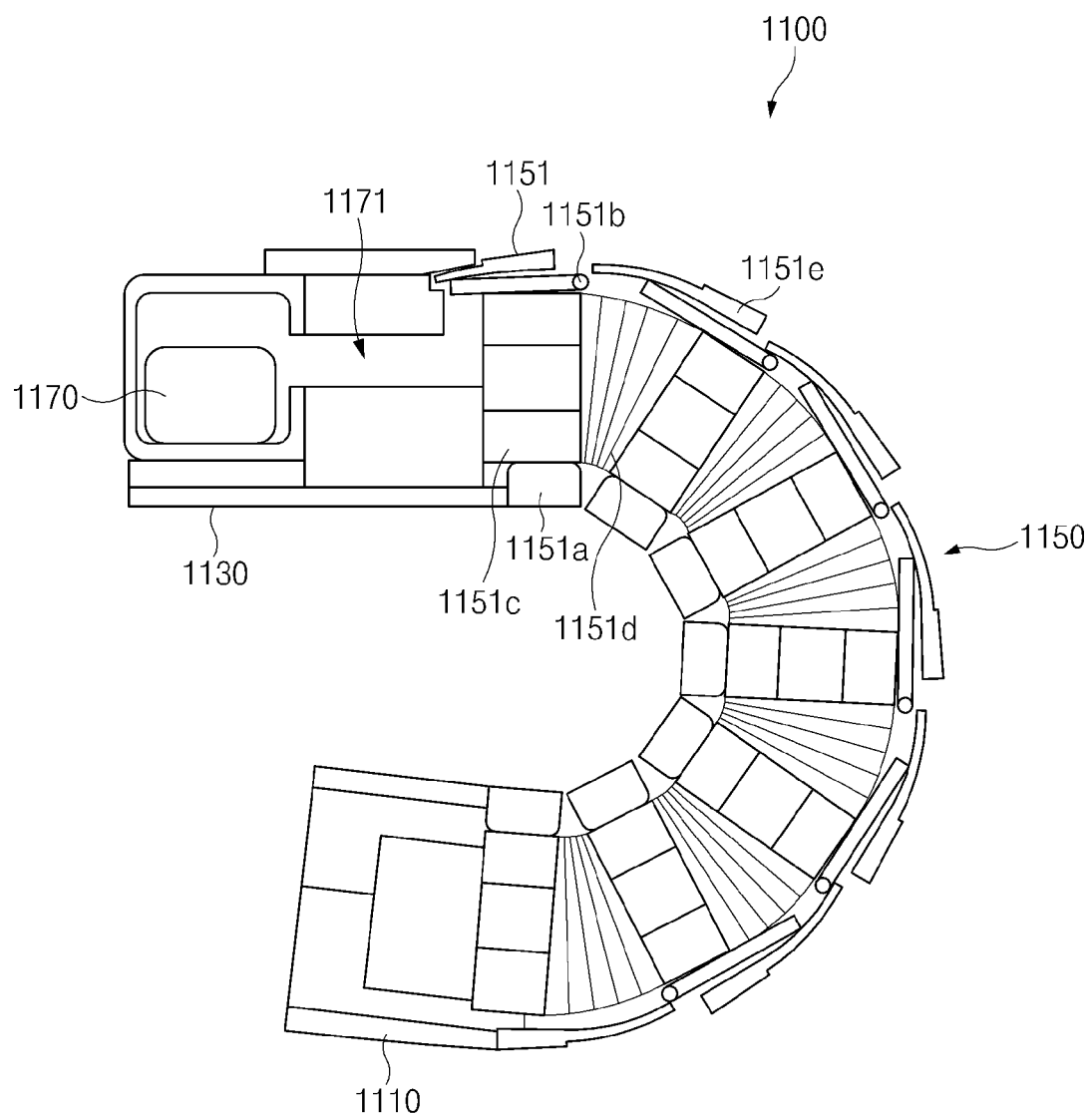
FIG. 11B is a view illustrating a state of the sound leakage preventing member of FIG. 10 in a state in which an electronic device is folded, according to an embodiment of the present disclosure.

FIG. 11A is a view illustrating a state of the sound leakage preventing member of FIG. 10 in a state in which an electronic device is unfolded, according to an embodiment of the present disclosure. FIG. 11B is a view illustrating a state of the sound leakage preventing member of FIG. 10 in a state in which an electronic device is folded, according to an embodiment of the present disclosure.

Referring to FIGS. 11A to 11B, the electronic device 1100 may include a housing 1110, and a display 1130. The housing 1110 includes a hinge unit 1150, and may be folded or unfolded through a hinge operation of the hinge unit 1150. In a state in which the housing 1110 is folded, the volumes of the spaces defined by the hinge members 1151 may increase, and the sound output from the speaker 1170 may be introduced into the spaces via a connecting member 1171 connecting the speaker 1170 and the hinge unit 1150.

According to an embodiment of the present disclosure, the hinge member 1151 may include a cover 1151e, a connector 1151a connecting the hinge member 1151 to the housing 1110, a cover connector 1151b connecting the cover 1151e of the hinge member 1151 to a cover member 1151e of another hinge member 1151, and a sound leakage preventing member 1151c for preventing the sound introduced into an inside space of the hinge member 1151 from being leaked.

According to an embodiment of the present disclosure, the hinge member 1151 may further include an envelopment member 1151d enveloping spaces between the hinge members 1151, which may be formed when the hinge members 1151 are arranged in a curved form in a state in which the housing 1110 is folded. The envelopment member 1151d may be disposed between the hinge members 1151 and may connect the hinge members 1151. The envelopment member 1151d may be formed of a flexible material, and may contract and expand during a hinge operation of the hinge unit 1150. For example, the envelopment member 1151d is contracted in a state in which the hinge members 1151 are arranged in a row and the housing 1110 is unfolded as illustrated in FIG. 11A, and the envelopment member 1151d is expanded in a state in which the hinge members 1151 are arranged in a curved form and the housing 1110 is folded as illustrated in FIG. 11B.

Figure 12:
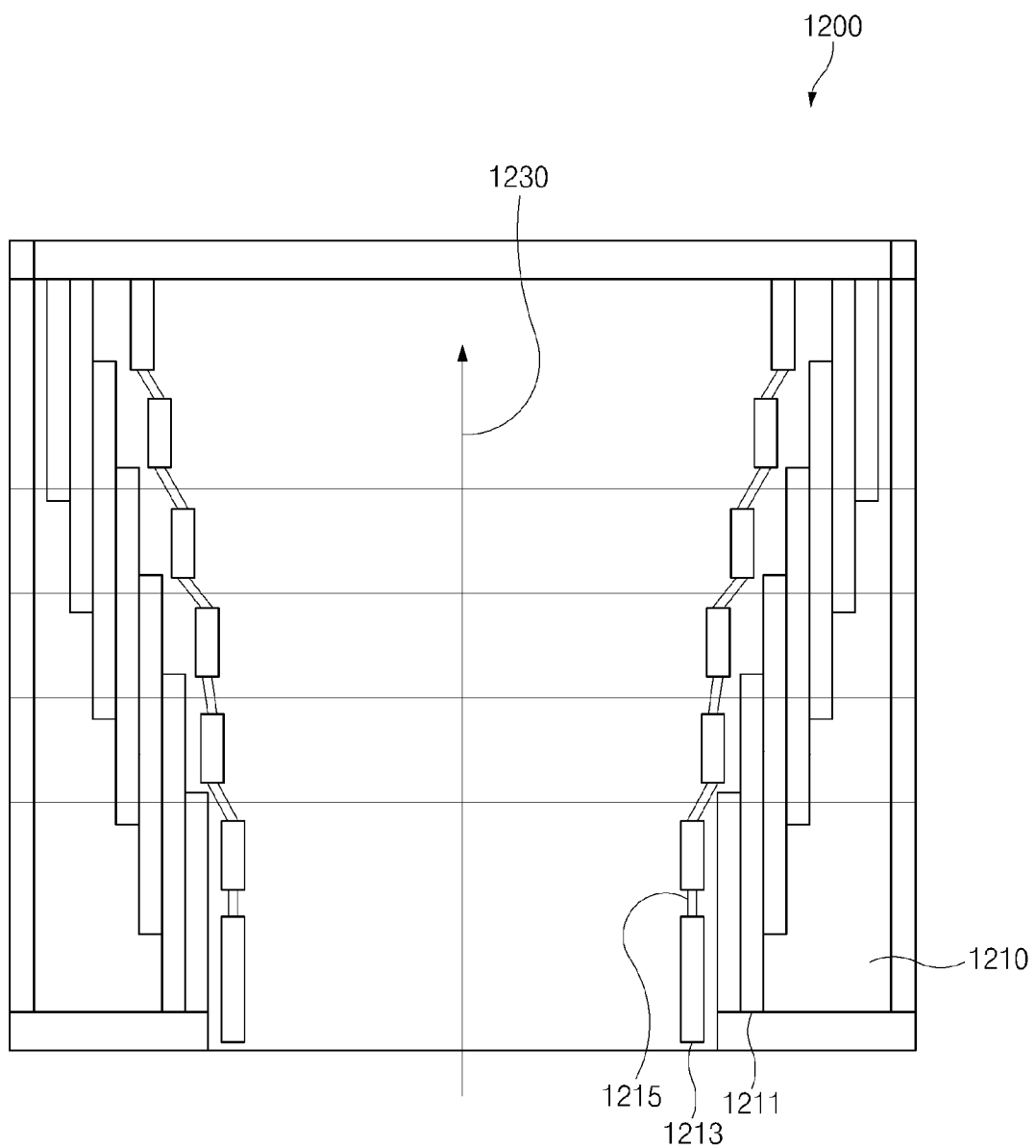
FIG. 12 is a view illustrating a back volume structure utilizing a hinge unit according to an embodiment of the present disclosure.

FIG. 12 is a view illustrating a back volume structure utilizing a hinge unit according to an embodiment of the present disclosure.

Referring to FIG. 12, a hinge unit 1200 may include a hinge member 1210. For example, the hinge unit 1200 may include a plurality of hinge members 1210, and the plurality of hinge members 1210 may be coupled to a housing by connectors 1211. According to an embodiment of the present disclosure, each of the plurality of hinge members 1210 may include an envelopment member 1215 connecting a sound leakage preventing member 1213 and an adjacent sound leakage preventing member 1213.

According to an embodiment of the present disclosure, the sound output from a speaker may be introduced into an inward direction 1230 of the hinge unit 1200. For example, the sound output from the speaker may be introduced into inside spaces defined by a plurality of hinge units 1210. In this case, the inside spaces defined by the plurality of hinge units 1210 may be utilized as a back volume of the speaker or a low sound preventing structure.

Figure 13:
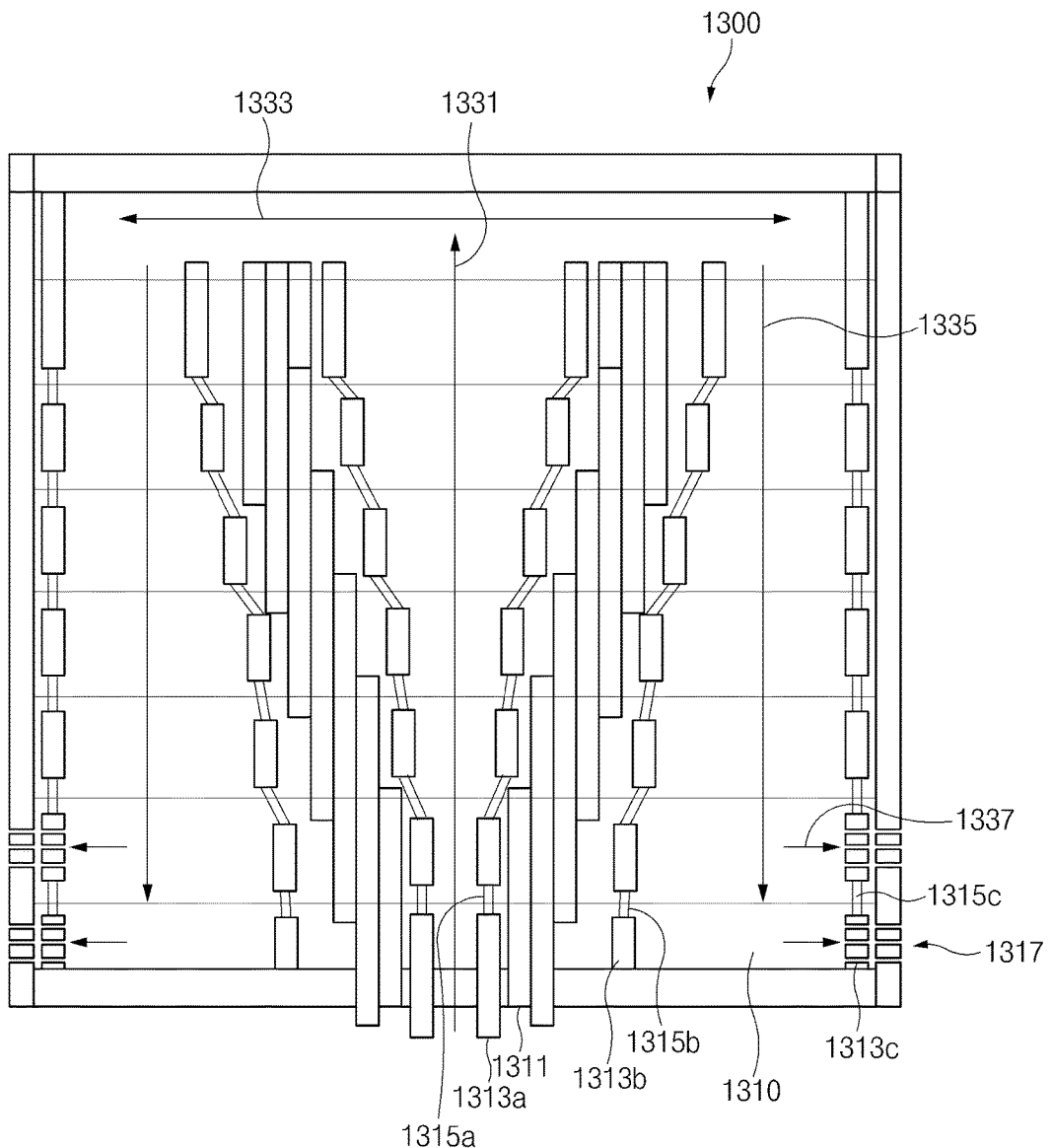
FIG. 13 is a view illustrating another back volume structure utilizing a hinge unit according to an embodiment of the present disclosure.

FIG. 13 is a view illustrating another back volume structure utilizing a hinge unit according to an embodiment of the present disclosure.

Referring to FIG. 13, a hinge unit 1300 may include a hinge member 1310. For example, the hinge unit 1300 may include a plurality of hinge members 1310, and the plurality of hinge members 1310 may be coupled to a housing by connectors 1311. According to an embodiment of the present disclosure, each of the plurality of hinge members 1310 may include a plurality of sound leakage preventing members and a plurality of envelopment members connecting the sound leakage preventing members.

According to an embodiment of the present disclosure, the hinge member 1310 may include a first sound leakage preventing member 1313*a* disposed at a central portion of the hinge unit 1300, a second sound leakage preventing member 1313*c* disposed at a side portion of the hinge unit 1300, and a third sound leakage preventing member 1313*b* disposed between the first sound leakage preventing member 1313*a* and the second sound leakage preventing member 1313*c*. Further, the hinge member 1310 may include first sealing members 1315*a* connecting the adjacent first sound leakage preventing members 1313*a*, second sealing members 1315*c* connecting the adjacent second sound leakage preventing members 1313*c*, and third sealing members 1315*b* connecting the adjacent third sound leakage preventing members 1313*b*. A hole 1317 may be formed in at least one of the second sound leakage preventing members 1313*c*. A hole may be formed in at least one of the second sealing members 1315*c*.

According to an embodiment of the present disclosure, the sound output from a speaker may be introduced into an inward direction 1331 of the hinge unit 1300. For example, the sound output from the speaker may be introduced into inside spaces defined by a plurality of hinge units 1310. In this case, the inside spaces defined by the plurality of hinge units 1310 may be utilized as a back volume of the speaker or a low sound preventing structure. The sound introduced to an inward direction 1331 of the hinge unit 1300 may move along the inner surface of the hinge unit 1300. For example, the sound introduced to the inward direction 1331 of the hinge unit 1300 may move to the left and right direction 1333 along an upper surface of the hinge unit 1300, and may in turn move to a downward direction 1335 along the left and right surfaces of the hinge unit 1300. The sound that moved to the downward direction 1335 of the hinge unit 1300 may be discharged to the outside through a hole 1317 formed in at least one of the second sound leakage preventing members 1313*c*.

Figure 14:
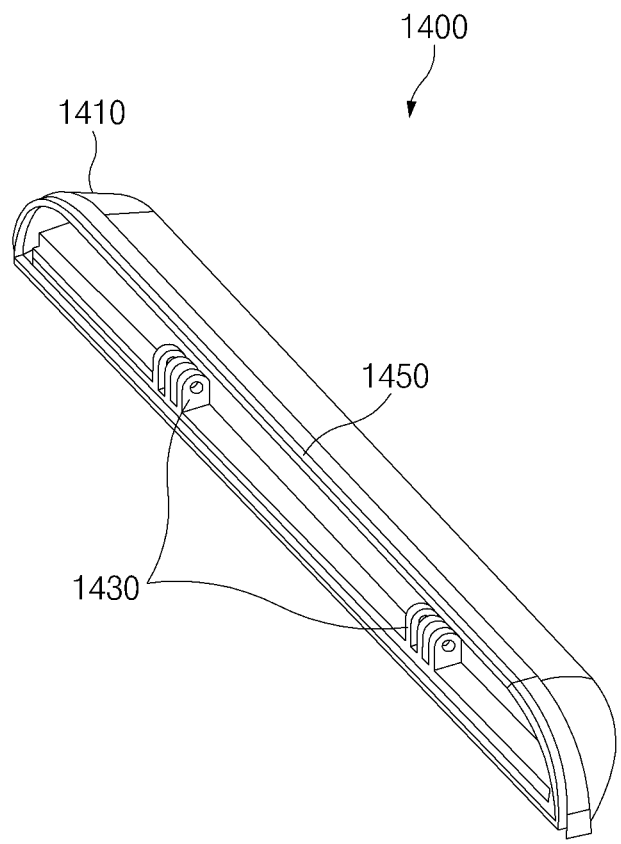
FIG. 14 is a perspective view of a hinge member including a sound leakage preventing bonding member for preventing sound from being leaked, according to an embodiment of the present disclosure.

FIG. 14 is a perspective view of a hinge member including a sound leakage preventing bonding member for preventing sound from being leaked, according to an embodiment of the present disclosure.

Referring to FIG. 14, the hinge member 1400 may include a cover 1410, a connector 1430, and a sound leakage preventing bonding member 1450. The cover 1410 may include a front surface, a rear surface, and a side surface partially surrounding a space between the front surface and the rear surface. According to an embodiment of the present disclosure, the cover 1410 may have a shape that is recessed on one surface thereof. For example, the cover 1410 may have a dome shape. For example, both the front surface and the rear surface of the cover 1410 may protrude towards the front surface.

The connectors 1430 may couple the hinge members 1400 to the housing. According to an embodiment of the present disclosure, the connectors 1430 may be disposed on an inner surface of the hinge member 1400. For example, the cover 1410 may be recessed, and the connectors 1430 may be disposed on an inner surface of the recessed cover 1410. The connector 1430 may have a hole such that a hinge shaft of the hinge member 1400 may be inserted into the hole. The hinge member 1400 may include one connector 1430, and may include a plurality of connectors 1430 for a strong coupling force.

When the sound output from the speaker is introduced, the sound leakage preventing bonding member 1450 may prevent the introduced sound from being leaked to the outside. According to an embodiment of the present disclosure, the sound leakage preventing bonding member 1450 may be attached to a side surface of the cover 1410. For example, the sound leakage preventing bonding member 1450 may be attached in a circular or elliptical form along the side surface of the cover 1410. Accordingly, if the sound output from the speaker is introduced into the cover 1410 of the hinge member 1400, it may not be leaked to the outside due to the sound leakage preventing bonding member 1450. The sound leakage preventing bonding member 1450 may include a poron tape.

Figure 15A:
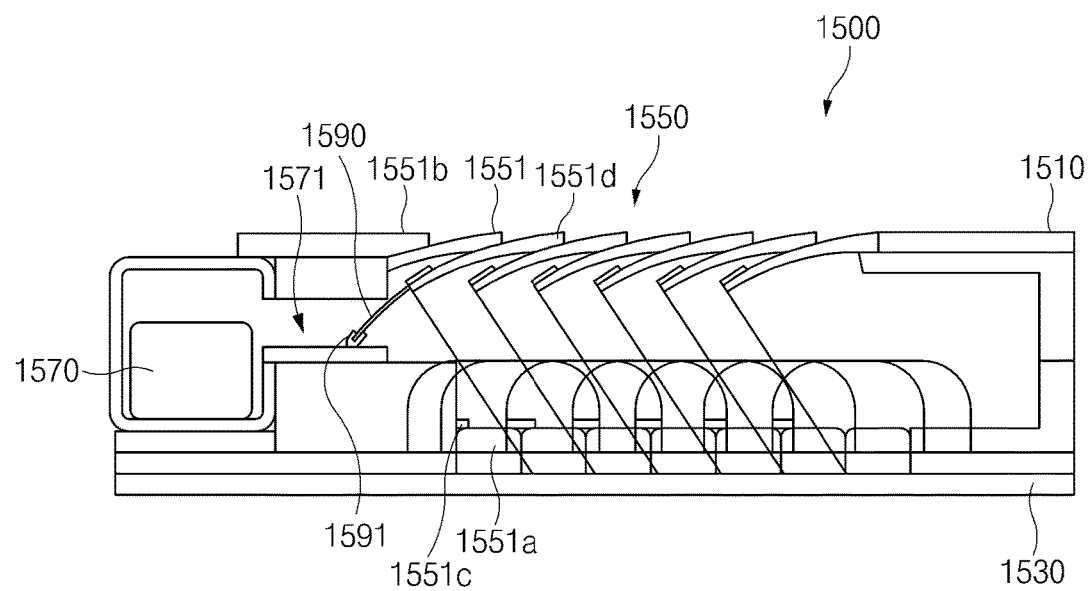
FIG. 15A is a view illustrating a state of the sound leakage preventing bonding member of FIG. 14 in a state in which an electronic device is unfolded, according to an embodiment of the present disclosure.
Figure 15B:
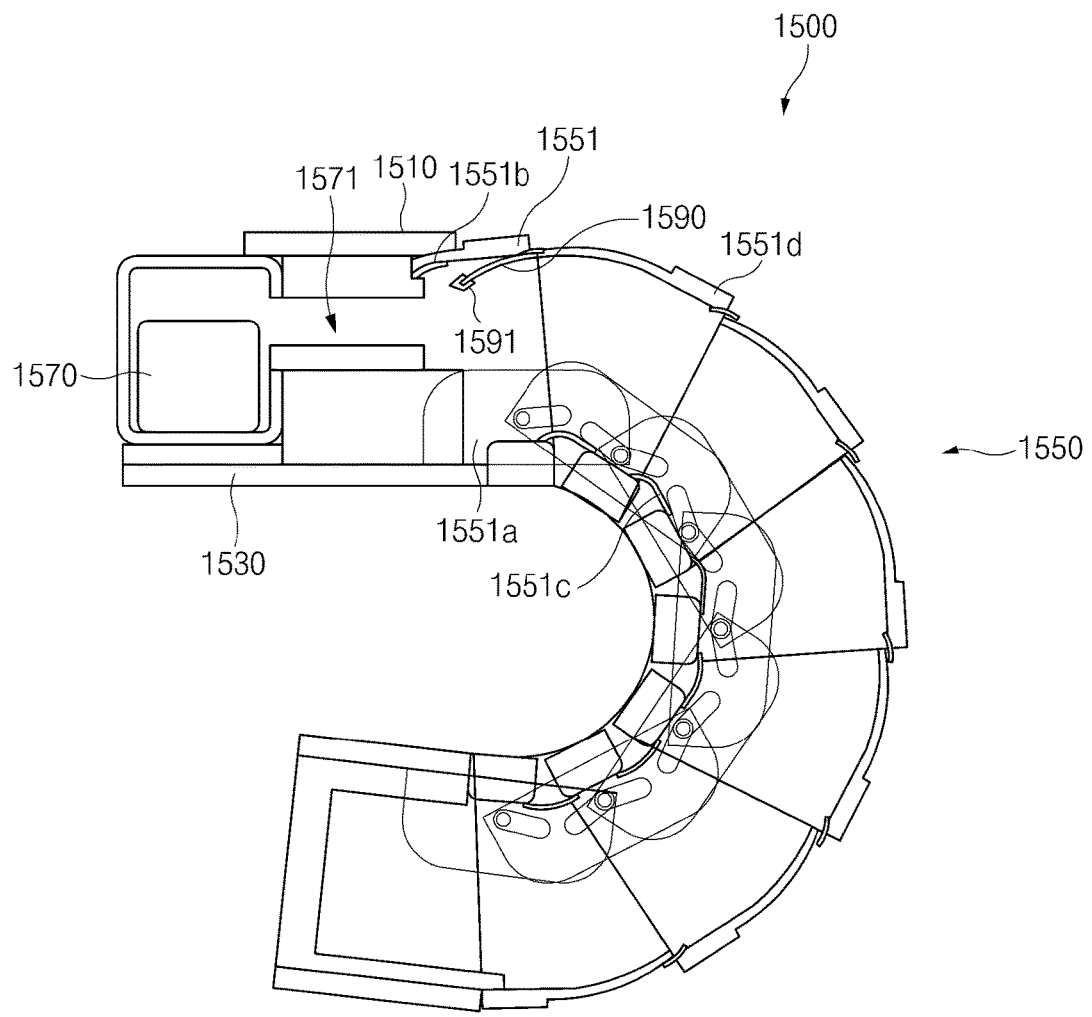
FIG. 15B is a view illustrating a state of the sound leakage preventing member of FIG. 14 in a state in which an electronic device is folded, according to an embodiment of the present disclosure.

FIG. 15A is a view illustrating a state of the sound leakage preventing bonding member of FIG. 14 in a state in which an electronic device is unfolded, according to an embodiment of the present disclosure. FIG. 15B is a view illustrating a state of the sound leakage preventing member of FIG. 14 in a state in which an electronic device is folded, according to an embodiment of the present disclosure.

Referring to FIGS. 15A to 15B, the electronic device 1500 may include a housing 1510 and a display 1530. The housing 1510 includes a hinge unit 1550, and may be folded or unfolded through a hinge operation of the hinge unit 1550. In a state in which the housing 1510 is folded, the volumes of the spaces defined by the hinge members 1551 may increase, and the sound output from the speaker 1570 may be introduced into the spaces via a connecting member 1571 connecting the speaker 1570 and the hinge unit 1550.

According to an embodiment of the present disclosure, the hinge member 1551 may include a cover 1551*d*, a connector 1551*a* connecting the hinge member 1551 to the housing 1510, and sound leakage preventing bonding members 1551*b* and 1551*c* for preventing the sound introduced into a side space of the hinge member 1551 from being leaked. The sound leakage preventing bonding members 1551*b* and 1551*c* may be attached in a circular or elliptical form along a side surface of the cover 1551*d* of the hinge member 1551. For example, on a section of the electronic device 1500 illustrated in FIGS. 15A and 15B, a first sound leakage preventing bonding member 1551*b* may be attached to an upper end of the cover 1551*d* of the hinge member 1551, and a second sound leakage preventing bonding member 1551*c* may be attached to a lower end of the cover 1551*d* of the hinge member 1551.

According to an embodiment of the present disclosure, the hinge member 1551 may include an additional sound leakage preventing member 1590 for preventing introduced sound from being leaked, by blocking a space by which the covers 1551*d* of the hinge members 1551 may be spaced apart from each other, in a state in which the housing 1510 is folded. The additional sound leakage preventing member 1590 may include an additional sound leakage preventing bonding member 1591 at a periphery thereof.

Figure 16A:
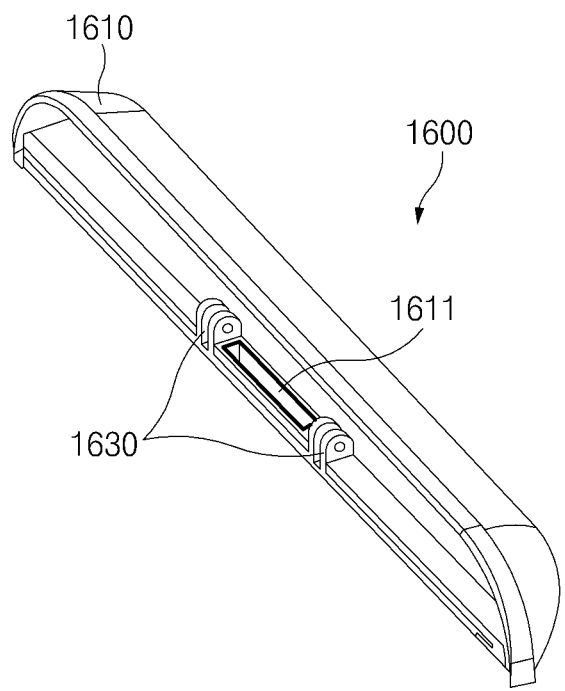
FIG. 16A is a perspective view of a hinge member illustrating a passage for sound output from a film speaker, according to an embodiment of the present disclosure.
Figure 16B:
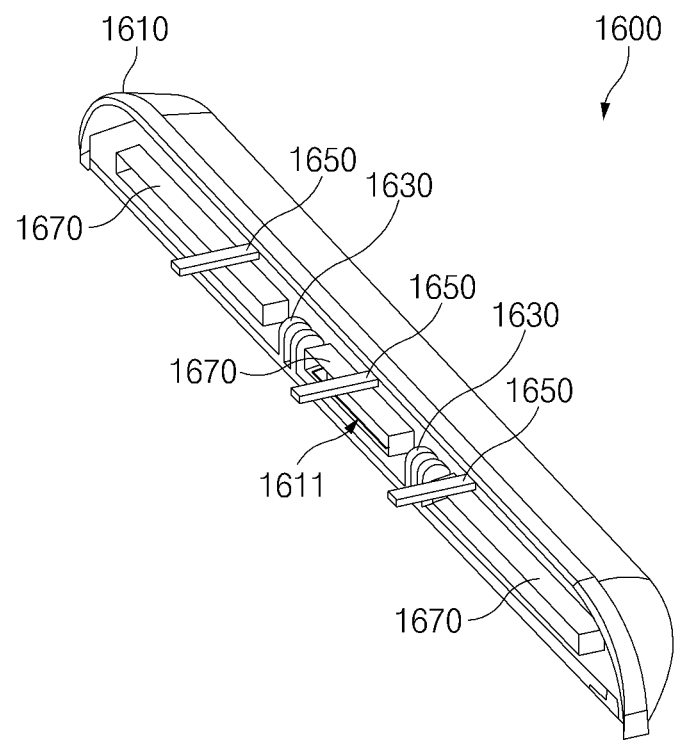
FIG. 16B is a view illustrating a state in which a sound leakage preventing member is applied to the hinge member of FIG. 16A, according to an embodiment of the present disclosure.
Figure 16C:
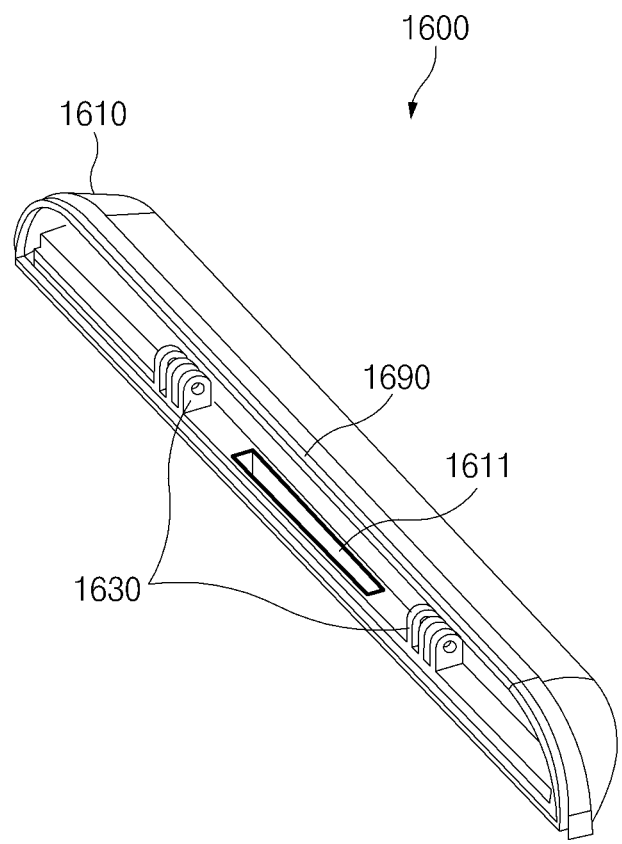
FIG. 16C is a view illustrating a state in which a sound leakage preventing bonding member is applied to the hinge member of FIG. 16A, according to an embodiment of the present disclosure.

FIG. 16A is a perspective view of a hinge member illustrating a passage for sound output from a film speaker, according to an embodiment of the present disclosure. FIG. 16B is a view illustrating a state in which a sound leakage preventing member is applied to the hinge member of FIG. 16A, according to an embodiment of the present disclosure. FIG. 16C is a view illustrating a state in which a sound leakage preventing bonding member is applied to the hinge member of FIG. 16A, according to an embodiment of the present disclosure.

Referring to FIGS. 16A to 16C, with reference to FIG. 16A, the hinge member 1600 may include a cover 1610, and a connector 1630. The cover 1610 may include a front surface, a rear surface, and a side surface partially surrounding a space between the front surface and the rear surface. According to an embodiment of the present disclosure, the cover 1610 may have a shape that is recessed on one surface thereof. For example, the cover 1610 may have a dome shape. For example, both the front surface and the rear surface of the cover 1610 may protrude towards the front surface.

The connectors 1630 may couple the hinge members 1600 to the housing. According to an embodiment of the present disclosure, the connectors 1630 may be disposed on an inner surface of the hinge member 1600. For example, the cover 1610 may be recessed, and the connectors 1630 may be disposed on an inner surface of the recessed cover 1610. The connector 1630 may have a hole such that a hinge shaft of the hinge member 1600 may be inserted into the hole. The hinge member 1600 may include one connector 1630, and may include a plurality of connectors 1630 for a strong coupling force.

According to an embodiment of the present disclosure, the hinge member 1600 may have an opening through which the sound output from a film speaker disposed inside the housing and connected to a rear surface of a display may be introduced into the hinge member 1600. For example, the opening 1611 may be formed to pass through an inner surface and an outer surface of the hinge member 1600. Although it is illustrated that the opening 1611 is formed between the connectors 1630, the present disclosure is not limited thereto.

According to an embodiment of the present disclosure, as illustrated in FIG. 16B, the hinge member 1600 may include a cover connector 1650 and a sound leakage preventing member 1670. The cover connector 1650 may connect a cover 1610 of one of the hinge members 1600 to a cover 1610 of another hinge member 1600. The cover connector 1650 may have a shape that protrudes from a side surface of the cover 1610. For example, the cover connector 1650 may protrude from a portion of an upper surface of the cover 1610. The hinge member 1600 may include one cover connector 1650, and may include a plurality of cover connectors 1650 for a strong coupling force between the covers 1610.

When the sound output from the film speaker is introduced into the hinge member 1600, the sound leakage preventing member 1670 may prevent the introduced sound from being leaked to the outside. According to an embodiment of the present disclosure, the sound leakage preventing member 1670 may be disposed on an inner surface of the recessed cover 1610. An opening 1611 may be formed on a first surface of the sound leakage preventing member 1670, which is disposed in a direction in which the sound output from the film speaker is introduced, and a second surface of the sound leakage preventing member 1670 may be blocked. Accordingly, the sound output from the film speaker may be introduced through the opening 1611 formed on the first surface, and the introduced sound may not be leaked because the second surface is blocked.

According to an embodiment of the present disclosure, as illustrated in FIG. 16C, the hinge member 1600 may include a sound leakage preventing bonding member 1690. When the sound output from the film speaker is introduced, the bonding member 1690 may prevent the introduced sound from being leaked to the outside. The bonding member 1690 may be attached to a side surface of the cover 1610. For example, the bonding member 1690 may be attached in a circular or elliptical form along the side surface of the cover 1610. The bonding member 1690 may include a poron tape.

Figure 17A:
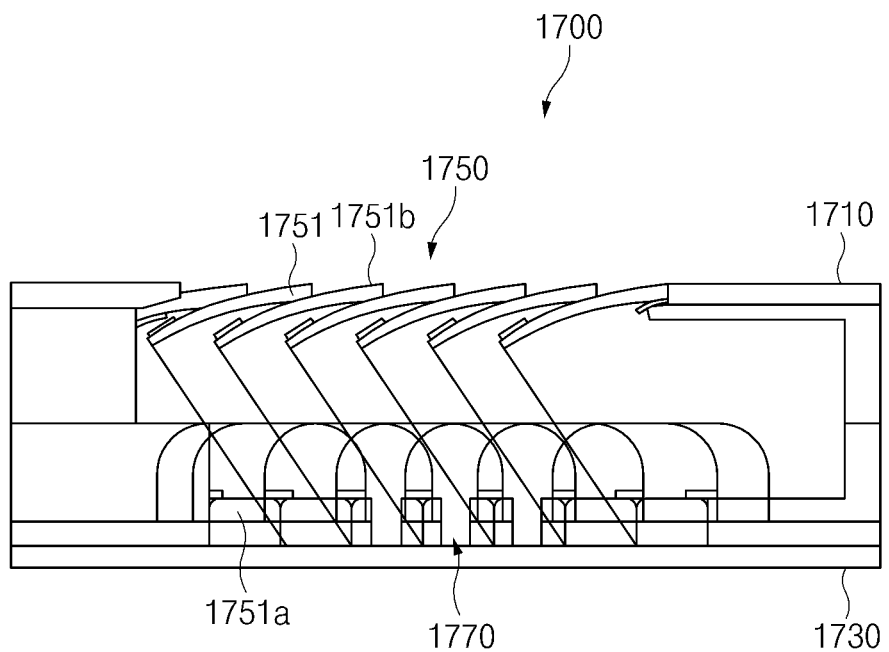
FIG. 17A is a view illustrating a passage for sound output from a film speaker in a state in which an electronic device is unfolded, according to an embodiment of the present disclosure.
Figure 17B:
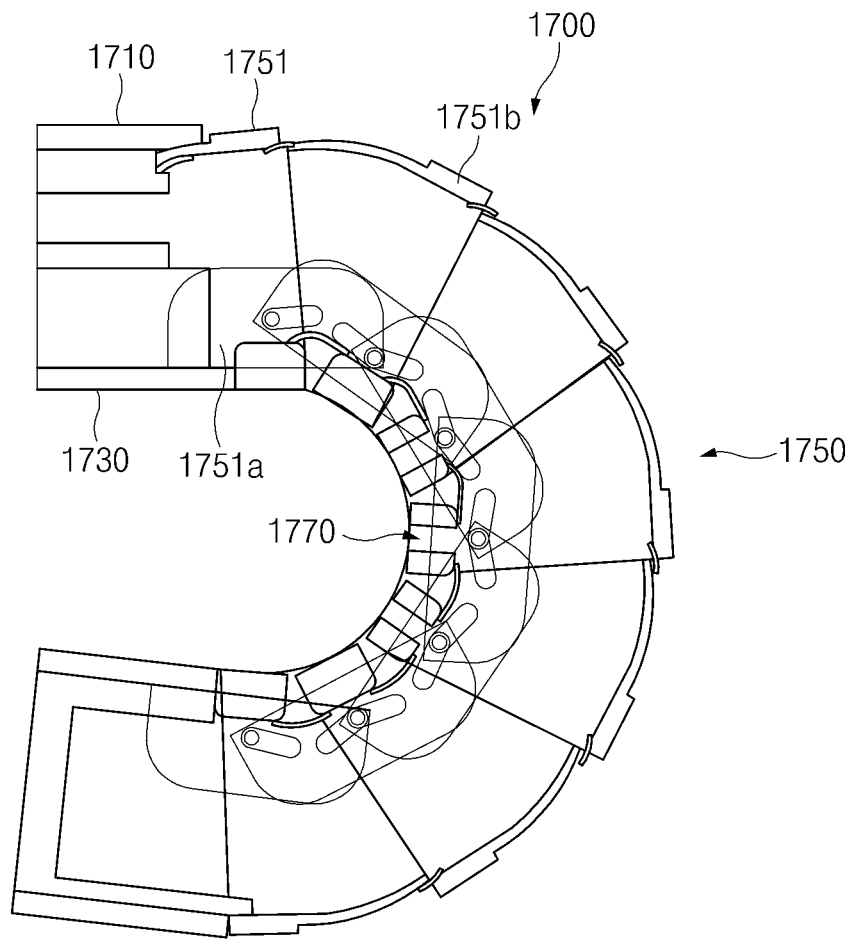
FIG. 17B is a view illustrating a passage for sound output from a film speaker in a state in which an electronic device is folded, according to an embodiment of the present disclosure.

FIG. 17A is a view illustrating a passage for sound output from a film speaker in a state in which an electronic device is unfolded, according to an embodiment of the present disclosure. FIG. 17B is a view illustrating a passage for sound output from a film speaker in a state in which an electronic device is folded, according to an embodiment of the present disclosure.

Referring to FIGS. 17A to 17B, the electronic device 1700 may include a housing 1710 and a display 1730. The housing 1710 includes a hinge unit 1750, and may be folded or unfolded through a hinge operation of the hinge unit 1750. According to an embodiment of the present disclosure, the hinge unit 1750 includes a plurality of hinge members 1751, and each of the hinge members 1751 may include a cover 1751b and a connector 1751a connecting the hinge member 1751 to the housing 1710.

According to an embodiment of the present disclosure, the hinge member 1751 may have an opening 1770 through which the sound output from a film speaker disposed inside the housing 1710 and connected to a rear surface of the display 1730 may be introduced into the hinge member 1751. For example, the opening 1770 may be formed to pass through an inner surface and an outer surface of the hinge member 1751. As illustrated, the opening 1770 is formed between the connectors 1751a.

Figure 18:
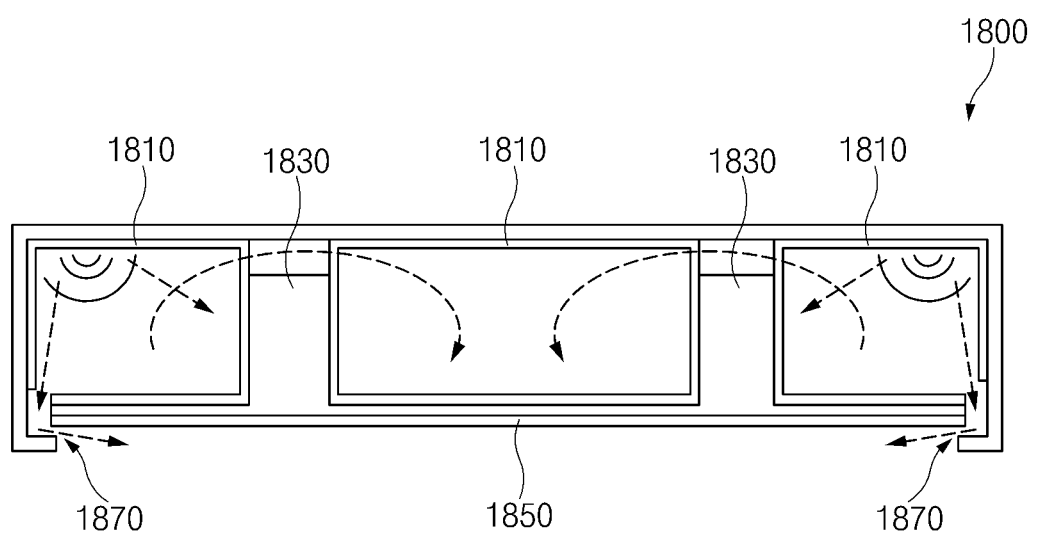
FIG. 18 is a view illustrating another low sound reflecting structure utilizing a hinge unit according to an embodiment of the present disclosure.

FIG. 18 is a view illustrating another low sound reflecting structure utilizing a hinge unit according to an embodiment of the present disclosure.

Referring to FIG. 18, the hinge unit 1800 includes a plurality of hinge members 1810, and the hinge members 1810 may be connected to each other through connectors 1830. According to an embodiment of the present disclosure, a partial area of the hinge unit 1800 may be opened such that sound output from a speaker may be discharged to the outside, and the sound may be discharged to the outside through an opening 1870 connected to an opened area. For example, a partial area of a hinge member 1810, which is disposed at an outskirt of the hinge members 1810 included in the hinge unit 1800, may be opened. Accordingly, if sound output from the speaker is introduced into the hinge member 1810, the introduced sound is delivered to another hinge member 1810 via the connector 1830, and if the introduced sound is delivered to the hinge member 1810 disposed at an outermost side of the hinge unit 1800, the sound may be discharged to the outside through the opened area. In this process, because an inner space of the hinge unit 1800 is used for a passage for the introduced sound, the sound quality of the speaker may be improved.

According to an embodiment of the present disclosure, the opening 1870 connected to the opened area may be formed between the display 1850 and the housing. As illustrated the opening 1870 is formed between the display 1850 and the hinge unit 1800 defining a portion of the housing.

Figure 19:
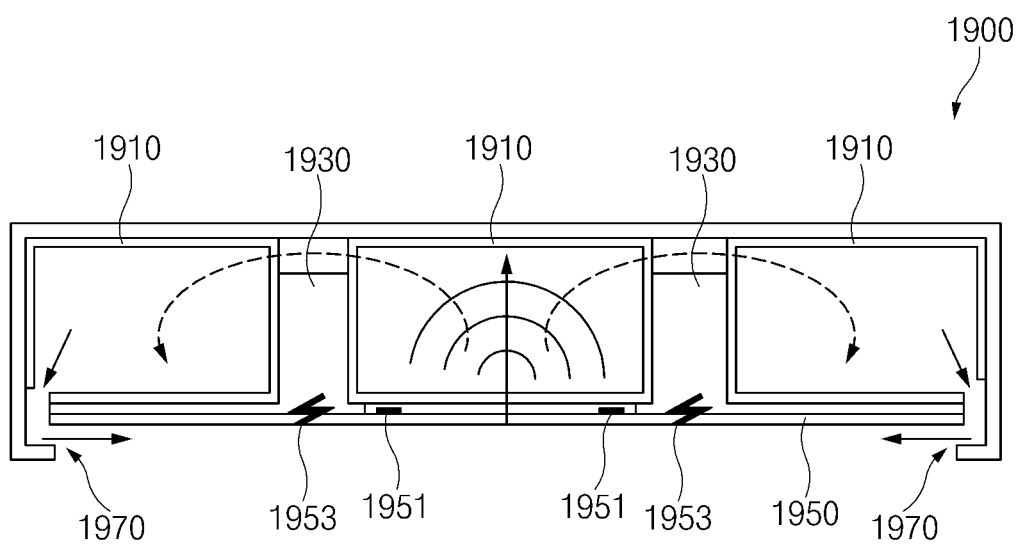
FIG. 19 is a view illustrating another low sound reflecting structure utilizing a hinge unit according to an embodiment of the present disclosure.

FIG. 19 is a view illustrating another low sound reflecting structure utilizing a hinge unit according to an embodiment of the present disclosure.

Referring to FIG. 19, the hinge unit 1900 includes a plurality of hinge members 1910, and the hinge members 1910 may be connected to each other through connectors 1930. According to an embodiment of the present disclosure, a partial area of the hinge unit 1900 may be opened such that sound output from a film speaker 1951 may be discharged to the outside, and the sound may be discharged to the outside through an opening 1970 connected to an opened area. For example, a partial area of a hinge member 1910, which is disposed at an outskirt of the hinge members 1910 included in the hinge unit 1900 may be opened. Accordingly, if sound output from the film speaker 1951 is introduced into the hinge member 1910, the introduced sound is delivered to another hinge member 1910 via the connector 1930, and if the introduced sound is delivered to the hinge member 1910 disposed at an outermost side of the hinge unit 1900, the sound may be discharged to the outside through the opened area.

According to an embodiment of the present disclosure, the opening 1970 connected to the opened area may be formed between the display 1950 and the housing. For example, the opening 1970 may be formed between the display 1950 and the hinge unit 1900 defining a portion of the housing.

According to an embodiment of the present disclosure, the film speaker 1951 may be connected to a rear surface of the display 1950. For example, the film speaker 1951 may include a piezoelectric sensor connected to a rear surface of the display 1950. The film speaker 1951 may generate a sound wave by using vibration of the piezoelectric sensor.

According to an embodiment of the present disclosure, the display 1950 may be fixed to the hinge unit 1900 through a fixing member 1953. The display 1950 may be fixed to the connector 1930 through the fixing member 1953. The fixing member 1953 may be formed of an elastic material having a specific elastic force.

As described above, according to various embodiments of the present disclosure, an electronic device may include a housing including a first surface facing a first direction, a second surface facing a second direction that is opposite to the first direction, and a side surface surrounding a portion of a space between the first surface and the second surface, a display seated inside the housing and from which a screen is exposed through one surface of the housing, and a speaker disposed inside the housing. The housing may further include a hinge unit disposed at a portion of the side surface and a portion of the second surface and configured to perform a hinge operation such that the housing is unfolded or folded, a first speaker hole formed in a partial area of the side surface, which is adjacent to the speaker, and a second speaker hole formed in a partial area of the first surface, which is adjacent to the speaker. The first speaker hole may be opened and the second speaker hole may be closed in a state in which the housing is unfolded through the hinge operation of the hinge unit, and the first speaker hole may be closed and the second speaker hole may be opened in a state in which the housing is folded through the hinge operation of the hinge unit.

According to various embodiments of the present disclosure, the speaker may be disposed inside a central portion of the housing.

According to various embodiments of the present disclosure, the second speaker hole may be formed in a bezel area of the first surface of the housing, which surrounds the display.

According to various embodiments of the present disclosure, the electronic device may further include a sliding member disposed inside the housing and configured to be slid in a lengthwise direction of the housing through the hinge operation of the hinge unit. The sliding member may include a first opening formed on a surface of the sliding member, which faces the side surface of the housing, and a second opening formed on a surface of the sliding member, which faces the first surface of the housing. The first opening may be positioned at a location that is aligned with the first speaker hole in a state in which the housing is unfolded, and the second opening may be positioned at a location that is aligned with the second speaker hole in a state in which the housing is folded.

According to various embodiments of the present disclosure, the sliding member may be connected to an elastic member disposed inside the housing.

According to various embodiments of the present disclosure, the first speaker hole and the second speaker hole may be arranged on the same line facing a widthwise direction of the housing.

According to various embodiments of the present disclosure, the hinge unit may include at least one hinge member, and the at least one hinge member may include a cover including a front surface, a rear surface, and a side surface surrounding a portion of a space between the front surface and the rear surface, and a connector disposed on an inside surface of the cover and coupled to the housing.

According to various embodiments of the present disclosure, the front surface and the rear surface of the cover may protrude towards the front surface.

According to various embodiments of the present disclosure, the at least one hinge member may include a first hinge member, and a second hinge member that is adjacent to the first hinge member, and the first hinge member may further include a cover connector connecting a cover of the first hinge member to a cover of the second hinge member.

According to various embodiments of the present disclosure, the cover connector may protrude from a side surface of the cover of the first hinge member.

According to various embodiments of the present disclosure, the at least one hinge member may include a sound leakage preventing member disposed on an inside surface of the cover and configured to prevent sound output from the speaker from being leaked to the outside.

According to various embodiments of the present disclosure, an opening may be formed on one surface of the sound leakage preventing member and an opposite surface of the sound leakage preventing member may be blocked.

According to various embodiments of the present disclosure, the at least one hinge member may include a first hinge member, and a second hinge member that is adjacent to the first hinge member, and the first hinge member may further include an envelopment member connecting a sound leakage preventing member of the first hinge member and a sound leakage preventing member of the second hinge member such that a space between the first hinge member and the second hinge member is sealed.

According to various embodiments of the present disclosure, the envelopment member may be contracted if the housing is unfolded and may be expanded if the housing is folded.

According to various embodiments of the present disclosure, the at least one hinge member may further include a sound leakage preventing bonding member attached to a side surface of the cover and configured to prevent sound output from the speaker from being leaked to the outside.

According to various embodiments of the present disclosure, the sound leakage preventing bonding member may be attached in a circular or elliptical form along a side surface of the cover.

According to various embodiments of the present disclosure, the sound leakage preventing bonding member may include a poron tape.

According to various embodiments of the present disclosure, the speaker may include a film speaker connected to a rear surface of the display.

According to various embodiments of the present disclosure, the film speaker may include a piezoelectric sensor.

According to various embodiments of the present disclosure, the hinge unit may have an opening on one surface thereof such that sound output from the film speaker is introduced through the opening.

The term "module" used herein may represent a unit including one of hardware, software, and firmware, or a combination thereof. The term "module" may be interchangeably used with the terms "unit", "logic", "logical block", "component", and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application specific integrated circuit (ASIC) chip, a field programmable gate array (FPGA), and a programmable logic device for performing some operations, which are known or will be developed.

At least a part of devices (e.g., modules or functions thereof) or methods (e.g., operations) according to various embodiments of the present disclosure may be implemented as instructions stored in a computer-readable storage medium in the form of a program module. In the case where the instructions are performed by a processor, the processor may perform functions corresponding to the instructions.

A computer-readable recording medium may include a hard disk, a floppy disk, a magnetic medium (e.g., a magnetic tape), an optical medium (e.g., CD-ROM, DVD), a magneto-optical medium (e.g., a floptical disk), or a hardware device (e.g., a ROM, a RAM, a flash memory, or the like). The program instructions may include machine language code generated by compilers and high-level language code that can be executed by computers using interpreters. The above-mentioned hardware device may be configured to be operated as one or more software modules for performing operations of various embodiments of the present disclosure and vice versa.

A module or a program module according to various embodiments of the present disclosure may include at least one of the above-mentioned elements, or some elements may be omitted or other additional elements may be added. Operations performed by the module, the program module or other elements according to various embodiments of the present disclosure may be performed in a sequential, a parallel, a iterative or a heuristic way. Furthermore, some operations may be performed in another order or may be omitted, or other operations may be added.

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the embodiments of the present disclosure, but should be defined by the appended claims and equivalents thereof.

What is claimed is:

1. An electronic device comprising:
   a foldable housing including a first surface facing a first direction, a second surface facing a second direction that is opposite to the first direction, a side surface surrounding a portion of a space between the first surface and the second surface, a first speaker hole and a second speaker hole;
   a speaker disposed inside the housing; and
   a hinge unit configured to enable the housing to be folded and unfolded,
   wherein the first speaker hole is formed in a partial area of the side surface,
   wherein the second speaker hole is formed in a partial area of the first surface,
   wherein the first speaker hole is opened and the second speaker hole is closed when the housing is unfolded, and
   wherein the first speaker hole is closed and the second speaker hole is opened when the housing is folded.

2. The electronic device of claim 1, wherein the speaker is disposed inside a central portion of the housing.

3. The electronic device of claim 1, further comprising a display, wherein the second speaker hole is formed in a bezel area of the first surface of the housing, wherein the bezel area surrounds at least a portion of the display.

4. The electronic device of claim 1, further comprising:
   a sliding member disposed inside the housing and configured to be slid in a lengthwise direction of the housing,
   wherein the sliding member includes:
      a first opening formed on a first surface of the sliding member; and
      a second opening formed on a second surface of the sliding member,
   wherein the first opening is aligned with the first speaker hole when the housing is unfolded, and
   wherein the second opening is aligned with the second speaker hole when the housing is folded.

5. The electronic device of claim 4, wherein the sliding member is connected to an elastic member disposed inside the housing.

6. The electronic device of claim 1, wherein the first speaker hole and the second speaker hole are arranged on a same line facing a widthwise direction of the housing.

7. The electronic device of claim 1, wherein the hinge unit includes:
   at least one hinge member which includes:
      a cover including a front surface and a rear surface; and
      a connector disposed on an inside surface of the cover and coupled to the housing.

8. The electronic device of claim 7, wherein the cover further includes a side surface.

9. The electronic device of claim 8, wherein the at least one hinge member further includes:
   a sound leakage preventing bonding member attached to the side surface of the cover and configured to prevent sound output from the speaker from being leaked to the outside.

10. The electronic device of claim 9, wherein the sound leakage preventing bonding member is attached in a circular or elliptical form along the side surface of the cover.

11. The electronic device of claim 9, wherein the sound leakage preventing bonding member includes a poron tape.

12. The electronic device of claim 7, wherein the at least one hinge member includes:
   a first hinge member; and
   a second hinge member adjacent to the first hinge member, and wherein the first hinge member further includes:
a cover connector connecting a cover of the first hinge member to a cover of the second hinge member.

13. The electronic device of claim 12, wherein the cover connector protrudes from a side surface of the cover of the first hinge member.

14. The electronic device of claim 7, wherein the at least one hinge member includes:
a sound leakage preventing member disposed on the inside surface of the cover and configured to prevent sound output from the speaker from being leaked to the outside.

15. The electronic device of claim 14, wherein an opening is formed on one surface of the sound leakage preventing member and an opposite surface of the sound leakage preventing member is blocked.

16. The electronic device of claim 7, wherein the at least one hinge member further includes:
a first hinge member; and
a second hinge member adjacent to the first hinge member, and wherein the first hinge member includes an envelopment member connecting a sound leakage preventing member of the first hinge member and a sound leakage preventing member of the second hinge member such that a space between the first hinge member and the second hinge member is sealed.

17. The electronic device of claim 16, wherein the envelopment member contracts if the housing is unfolded and expands if the housing is folded.

18. The electronic device of claim 1, further comprising a display, wherein the speaker includes:
a film speaker connected to a rear surface of the display.

19. The electronic device of claim 18, wherein the film speaker includes:
a piezoelectric sensor.

20. The electronic device of claim 18, wherein sound output from the film speaker is introduced through an opening in one surface of the hinge unit of the electronic device.

* * * * *